US012772813B2

(12) United States Patent
Xie et al.

(10) Patent No.: US 12,772,813 B2
(45) Date of Patent: Oct. 20, 2026

(54) BOTTOM DIELECTRIC ISOLATION INTEGRATION WITH BURIED POWER RAIL

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Takeshi Nogami, Schenectady, NY (US); Roy R. Yu, Poughkeepsie, NY (US); Balasubramanian S. Pranatharthi Haran, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 659 days.

(21) Appl. No.: 17/528,858

(22) Filed: Nov. 17, 2021

(65) Prior Publication Data

US 2023/0154784 A1 May 18, 2023

(51) Int. Cl.
*H10D 62/17* (2025.01)
*H10D 30/67* (2025.01)
(Continued)

(52) U.S. Cl.
CPC ...... *H10W 20/021* (2026.01); *H10D 30/6735* (2025.01); *H10D 62/121* (2025.01);
(Continued)

(58) Field of Classification Search
CPC .... H10D 62/151; H10D 62/364; H10D 84/83; H10D 84/0158; H10D 84/834; H10D 84/013; H10D 84/0149; B82Y 10/00; H01L 21/743; H01L 21/76879; H01L 21/76897; H01L 23/5286; H01L 23/535;
(Continued)

(56) References Cited

U.S. PATENT DOCUMENTS

| | | | |
|---|---|---|---|
| 9,570,395 B1 | 2/2017 | Sengupta et al. |
| 10,043,798 B2 | 8/2018 | Cosemans et al. |

(Continued)

FOREIGN PATENT DOCUMENTS

| | | |
|---|---|---|
| EP | 3770952 A1 | 1/2021 |
| WO | 2023/089470 A1 | 5/2023 |

OTHER PUBLICATIONS

International Search Report issued in corresponding PCT Application Serial No. PCT/IB2022/060931 dated Feb. 6, 2023, 3 pgs.

(Continued)

*Primary Examiner* — Yara B Green
*Assistant Examiner* — Christopher M Roland
(74) *Attorney, Agent, or Firm* — Harrity & Harrity, LLP

(57) ABSTRACT

A semiconductor device is provided. The semiconductor device includes a protective liner, and a buried power rail on a first portion of the protective liner, wherein the protective liner is on opposite sides of the buried power rail. The semiconductor device further includes a source/drain on a second portion of the protective liner, wherein the source/drain is offset from the buried power rail, and a source/drain contact on the source/drain and in electrical communication with the buried power rail.

20 Claims, 18 Drawing Sheets

(51) Int. Cl.

| | |
|---|---|
| ***H10D 62/10*** | (2025.01) |
| ***H10D 62/13*** | (2025.01) |
| ***H10D 84/01*** | (2025.01) |
| ***H10D 84/83*** | (2025.01) |
| ***H10W 20/00*** | (2026.01) |
| ***H10W 20/20*** | (2026.01) |
| ***H10W 20/40*** | (2026.01) |
| ***H10W 20/41*** | (2026.01) |
| *H10D 84/03* | (2025.01) |

(52) U.S. Cl.

CPC ......... *H10D 62/151* (2025.01); *H10D 62/364* (2025.01); *H10D 84/013* (2025.01); *H10D 84/0149* (2025.01); *H10D 84/83* (2025.01); *H10W 20/20* (2026.01); *H10W 20/427* (2026.01); *H10W 20/481* (2026.01); *H10D 30/6757* (2025.01); *H10D 84/0151* (2025.01); *H10D 84/038* (2025.01); *H10W 20/069* (2026.01); *H10W 20/0698* (2026.01)

(58) Field of Classification Search

CPC ........... H10W 20/021; H10W 20/0698; H10W 20/20; H10W 20/427; H10W 20/481

See application file for complete search history.

(56) References Cited

U.S. PATENT DOCUMENTS

| | | | | |
|---|---|---|---|---|
| 10,586,765 | B2 | 3/2020 | Smith et al. | |
| 10,636,739 | B2 | 4/2020 | Beyne et al. | |
| 10,700,207 | B2 | 6/2020 | Chen et al. | |
| 10,720,391 | B1 | 7/2020 | Paul et al. | |
| 10,957,575 | B2 | 3/2021 | Yakimets et al. | |
| 2018/0151494 | A1* | 5/2018 | Ohtou | H10D 64/017 |
| 2019/0386011 | A1 | 12/2019 | Weckx et al. | |
| 2020/0098681 | A1* | 3/2020 | Kim | H01L 23/5286 |
| 2020/0105671 | A1 | 4/2020 | Lai et al. | |
| 2020/0119015 | A1 | 4/2020 | Bi et al. | |
| 2020/0266169 | A1 | 8/2020 | Kang et al. | |
| 2020/0273710 | A1 | 8/2020 | Zhang et al. | |
| 2020/0294860 | A1* | 9/2020 | Chang | H01L 21/76895 |
| 2020/0411436 | A1* | 12/2020 | Xie | H01L 21/02126 |
| 2021/0028112 | A1* | 1/2021 | Kim | H10D 84/0158 |
| 2021/0098294 | A1* | 4/2021 | Smith | H10D 84/038 |
| 2021/0193821 | A1 | 6/2021 | Dentoni Litta et al. | |
| 2021/0399099 | A1* | 12/2021 | Chu | H01L 21/28525 |
| 2022/0181197 | A1* | 6/2022 | Tao | H01L 23/5226 |
| 2022/0181453 | A1* | 6/2022 | Liebmann | H10D 30/6757 |
| 2023/0094466 | A1* | 3/2023 | Frougier | H01L 23/535 257/288 |
| 2023/0163020 | A1* | 5/2023 | Grant | H10D 84/017 257/382 |

OTHER PUBLICATIONS

Prasad et al., "Buried Power Rails and Back-side Power Grids: Arm® CPU Power Delivery Network Design Beyond 5nm", In2019 IEEE International Electron Devices Meeting (IEDM) Dec. 7, 2019 (pp. 19-1). IEEE.

Gupta et al., "Buried Power Rail Integration with Si FinFETs for CMOS Scaling beyond the 5 nm Node", 2020 IEEE Symposium on VLSI Technology, Jun. 16-19, 2020, 02 pages.

Prasad et al., "Buried Power Rails and Back-side Power Grids: Arm® CPU Power Delivery Network Design Beyond 5nm", 2019 IEEE International Electron Devices Meeting (IEDM), Dec. 7-11, 2019, 04 pages.

Zhang et al., "Full Bottom Dielectric Isolation to Enable Stacked Nanosheet Transistor for Low Power and High Performance Applications", 2019 IEEE International Electron Devices Meeting (IEDM), Dec. 7-11, 2019, 04 pages.

* cited by examiner

BOTTOM DIELECTRIC ISOLATION INTEGRATION WITH BURIED POWER RAIL

BACKGROUND

The present invention generally relates to nanosheet devices having bottom dielectric isolation, and more particularly to nanosheet devices having bottom dielectric isolation and a buried power rail.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows from a source to a drain. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a semiconductor device is provided. The semiconductor device includes a protective liner, and a buried power rail on a first portion of the protective liner, wherein the protective liner is on opposite sides of the buried power rail. The semiconductor device further includes a source/drain on a second portion of the protective liner, wherein the source/drain is offset from the buried power rail, and a source/drain contact on the source/drain and in electrical communication with the buried power rail.

In accordance with another embodiment of the present invention, a semiconductor device is provided. The semiconductor device includes a protective liner on a support pillar, and a buried power rail on a first portion of the protective liner, wherein the protective liner is on opposite sides of the buried power rail. The semiconductor device further includes a source/drain on a second portion of the protective liner, wherein the support pillar is on an opposite side of the second portion of the protective liner from the source/drain, and a plurality of nanochannels on the second portion of the protective liner, wherein the source/drain is in electrical contact with the plurality of nanochannels. The semiconductor device further includes a source/drain contact on the source/drain and in electrical communication with the buried power rail.

In accordance with yet another embodiment of the present invention, a method of forming a semiconductor device is provided. The method includes forming a separation trench through a stack of alternating nanosheet sections and sacrificial sections, a first sacrificial section, and into an underlying substrate mesa to form a stack of alternating nanosheet channels and sacrificial segments on a first sacrificial segment and a support pillar having a sidewall, and removing the first sacrificial section to form a first cavity. The method further includes forming a protective liner in the first cavity and on the sidewall of the support pillar, and forming a buried power rail on a first portion of the protective liner. The method further includes removing the sacrificial sections, and forming a source/drain on a second portion of the protective liner. The method further includes forming a source/drain contact electrically connecting the source/drain to the buried power rail.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Devices and fabrication method are provided relating to nanosheet channels separated from buried power rails by a dielectric liner. In various embodiments, a buried power rail can be formed in a substrate adjacent to a nanosheet stack.

Embodiments of the present invention provide etch selectivity that allows a device chip to be flipped and the backside removed through well controlled thinning. In various embodiments, a protective liner or etch-stop layer can provide etch selectivity without utilizing a semiconductor-on-insulator (SeOI) substrate.

Exemplary applications/uses to which the present invention can be applied include, but are not limited to: nanosheet devices.

It is to be understood that aspects of the present invention will be described in terms of a given illustrative architecture; however, other architectures, structures, substrate materials and process features and steps can be varied within the scope of aspects of the present invention.

Figure 1:
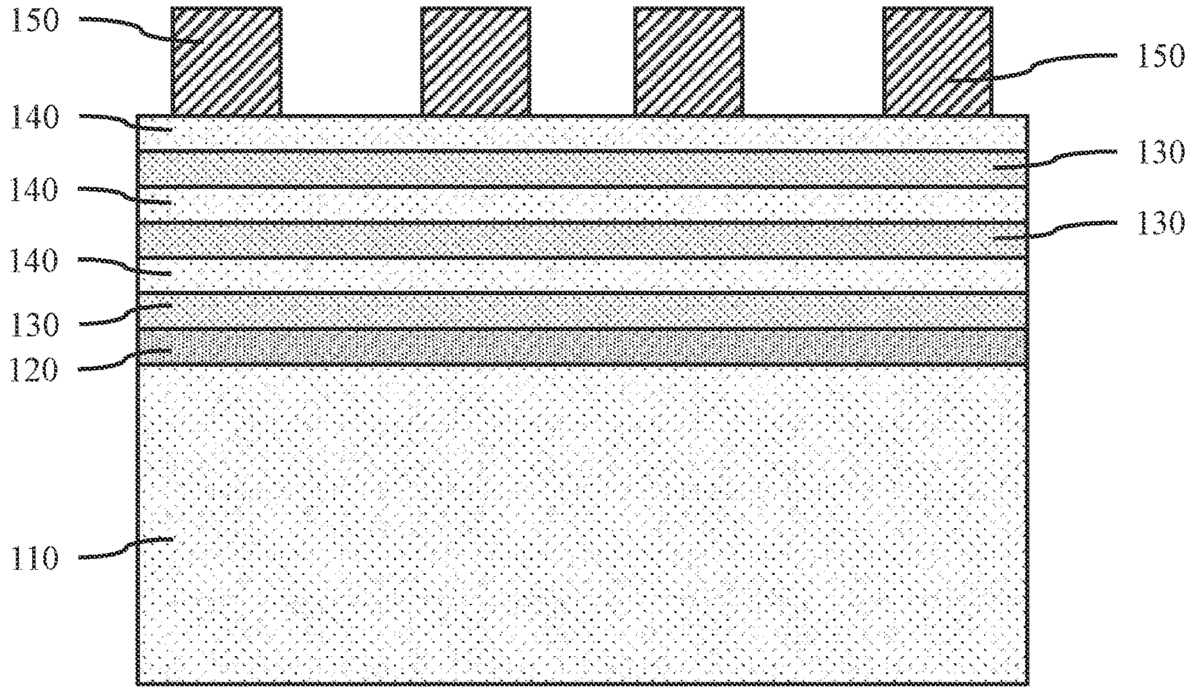
FIG. 1 is a cross-sectional side view showing a stack of alternating nanosheet layers and sacrificial layers on a substrate, in accordance with an embodiment of the present invention.

Referring now to the drawings in which like numerals represent the same or similar elements and initially to FIG. 1, FIG. 1 is a cross-sectional side view showing a stack of alternating nanosheet layers and sacrificial layers on a substrate, in accordance with an embodiment of the present invention;

In one or more embodiments, a plurality of alternating nanosheet layers 140 and sacrificial layers 130 can be formed on a substrate 110, where the alternating nanosheet layers 140 and sacrificial layers 130 can be formed by an epitaxial growth process on the surface of the substrate 110.

In various embodiments, the substrate 110 can be a semiconductor material, including, but not limited to, group IV semiconductors, for example, silicon (Si) and germanium (Ge), IV-IV compound semiconductors, for example, silicon carbide (Si) and silicon-germanium (SiGe), III-V semiconductors, for example, gallium nitride (GaN), gallium arsenide (GaAs), and indium phosphide (InP). The semiconductor substrate can be selected to provide a surface suitable for epitaxial growth of the intended nanosheet layers 140 and sacrificial layers 130, for example, having a crystalline structure that minimizes stress and/or defect formation in the epitaxial layers. In various embodiments, the substrate can be a single crystal wafer of the semiconductor material.

In one or more embodiments, the nanosheet layers 140 and sacrificial layers 130 can each be a semiconductor material, including, but not limited to, group IV semiconductors, for example, silicon (Si) and germanium (Ge), IV-IV compound semiconductors, for example, silicon carbide (Si) and silicon-germanium (SiGe), III-V semiconductors, for example, gallium nitride (GaN), gallium arsenide (GaAs), and indium phosphide (InP), where the materials of the nanosheet layers 140 and sacrificial layers 130 can be different from each other and from the substrate 110 to provide suitable etch selectivity. For example, an HNA etch can be specific for etching highly doped silicon (Si), but not lightly doped silicon (Si). Whereas, TEAH etchant can be specific for etching lightly doped silicon (Si), but not highly doped silicon (Si). Selecting appropriate materials and etchants can leverage the etch rate differences between the materials. In various embodiments, a selective etch rate can be an etch rate ratio of at least 100:1.

In various embodiments, the nanosheet layers 140 can have a thickness in a range of about 3 nanometers (nm) to about 15 nm, or about 4 nm to about 9 nm, although other thicknesses are also contemplated.

In various embodiments, the sacrificial layers 130 can have a thickness in a range of about 6 nanometers (nm) to about 20 nm, or about 8 nm to about 15 nm, although other thicknesses are also contemplated.

In various embodiments, the material of the nanosheet layers 140 can be chosen to provide semiconductor device channels, and the material of the sacrificial layers 130 can chosen to be selectively removable relative to the nanosheet layers 140.

In one or more embodiments, a first sacrificial layer 120 can be formed on the substrate 110 between the substrate and the stack of alternating nanosheet layers 140 and sacrificial layers 130, where the first sacrificial layer 120 can be selectively removed relative to the nanosheet layers 140 and sacrificial layers 130 and the substrate. The first sacrificial layer 120 can be formed by epitaxial growth on the substrate, where the first sacrificial layer 120 can be a material different from nanosheet layers 140 and sacrificial layers 130 and the substrate. The first sacrificial layer 120 can be made of a semiconductor material epitaxially formed on the substrate 110.

In various embodiments, the first sacrificial layer 120 can have a thickness in a range of about 4 nanometers (nm) to about 15 nm, or about 6 nm to about 10 nm, although other thicknesses are also contemplated.

In a non-limiting exemplary embodiment, the substrate 110 can be single crystal silicon (Si), the first sacrificial layer 120 can be silicon-germanium (SiGe) with a germanium concentration greater than 50 atomic percent (at. %), the sacrificial layers 130 can be silicon-germanium (SiGe) with a germanium concentration less than 40 at. %, and the nanosheet layers 140 can be silicon (Si). In various embodiments, the first sacrificial layer 120 can be, for example, silicon-germanium (SiGe) with a germanium concentration of about 60 at. % and the sacrificial layers 130 can be, for example, silicon-germanium (SiGe) with a germanium concentration of about 30 at. %.

In one or more embodiments, one or more etch templates 150 can be formed on the stack of alternating nanosheet layers 140 and sacrificial layers 130, where the etch templates 150 can be formed by lithographic and etching processes. The etch templates 150 can be patterned from a hardmask layer. In various embodiments, the etch templates 150 can be made of a hardmask material, including, but not limited to, silicon oxide (SiO), silicon nitride (SiN), silicon oxynitride (SiON), silicon carbide (SiC), silicon carbonitride (SiCN), silicon boro carbonitride (SiBCN), and combinations thereof. In various embodiments, the etch templates 150 can have multiple layers.

In various embodiments, adjacent pairs of etch templates 150 can be separated by a distance, for example, in a range of about 15 nm to about 120 nm, or about 35 nm to about 70 nm, although other distances are also contemplated.

Figure 2:
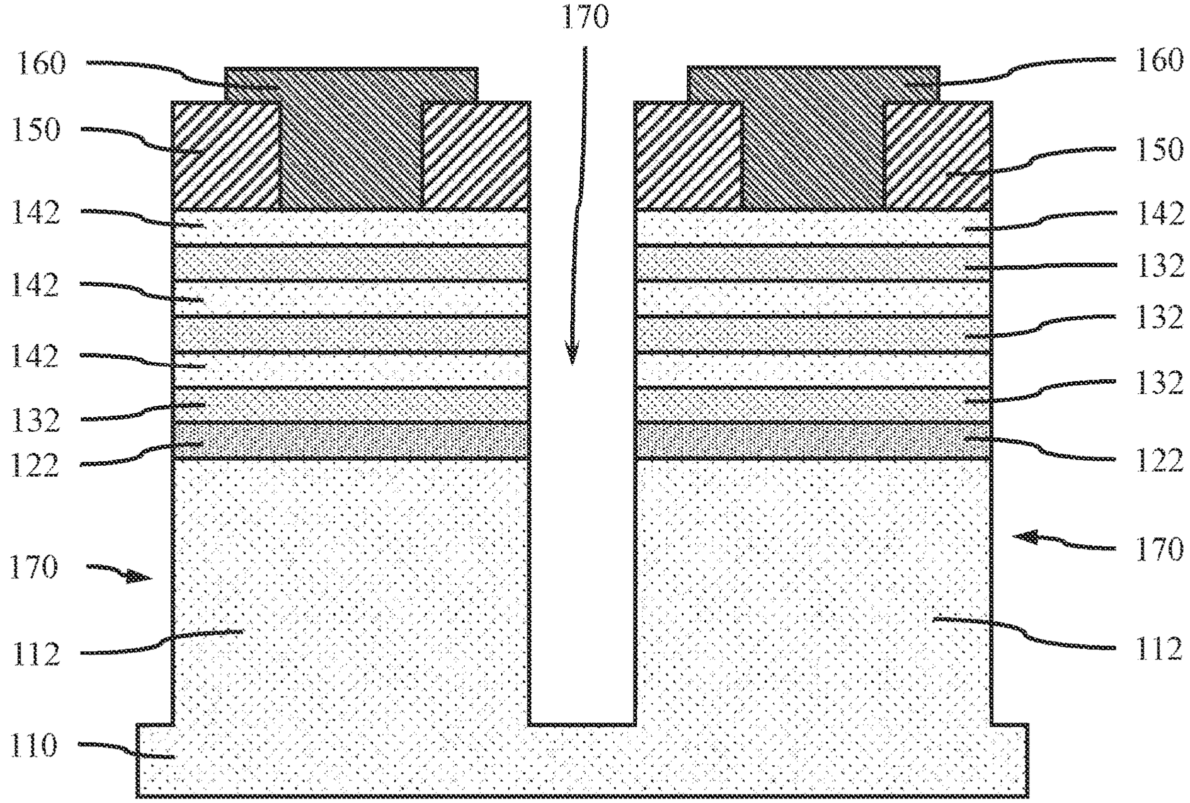
FIG. 2 is a cross-sectional side view showing a plurality of isolation trenches formed that divide the stack layers into nanosheet sections and sacrificial sections on substrate mesas, in accordance with an embodiment of the present invention.

FIG. 2 is a cross-sectional side view showing a plurality of isolation trenches formed that divide the stack layers into nanosheet sections and sacrificial sections on substrate mesas, in accordance with an embodiment of the present invention.

In one or more embodiments, an etch mask 160 can be formed on two or more etch templates 150, where the etch mask 160 can cover the portion of a top layer, for example, a top nanosheet layer 140 (although the top layer may also be a sacrificial layer 130) exposed between the two adjacent etch templates 150. The etch mask 160 can be formed by a blanket deposition, for example, spin-on coating of an organic planarization layer (OPL), and patterned by lithography and etching.

In one or more embodiments, a plurality of isolation trenches 170 can be formed through the stack of alternating nanosheet layers 140 and sacrificial layers 130, a first sacrificial layer 120, and into the underlying substrate 110 to form a stack of alternating nanosheet sections 142 and sacrificial sections 132 on a first sacrificial section 122 and a substrate mesa 112. The substrate mesas 112 have a flat topped feature with steep slopes, which captures the aspects of the raised features beneath the stacks. The isolation trenches 170 can be formed in the region between adjacent etch templates 150 that are not covered by an etch mask 160, where the isolation trenches 170 can be formed by a selective direction etch, for example, a reactive ion etch (RIE). Formation of the isolation trenches 170 can expose the sidewalls of the nanosheet layers 140 and sacrificial layers 130, and the substrate mesas 112.

In various embodiments, the isolation trenches 170 can extend a depth into the substrate 110 in a range of about 15 nm to about 200 nm, or about 50 nm to about 100 nm, although other depths are also contemplated. The isolation trenches 170 can have a width essentially equal to the distance between the etch templates 150 given the etching process and process tolerances.

Figure 3:
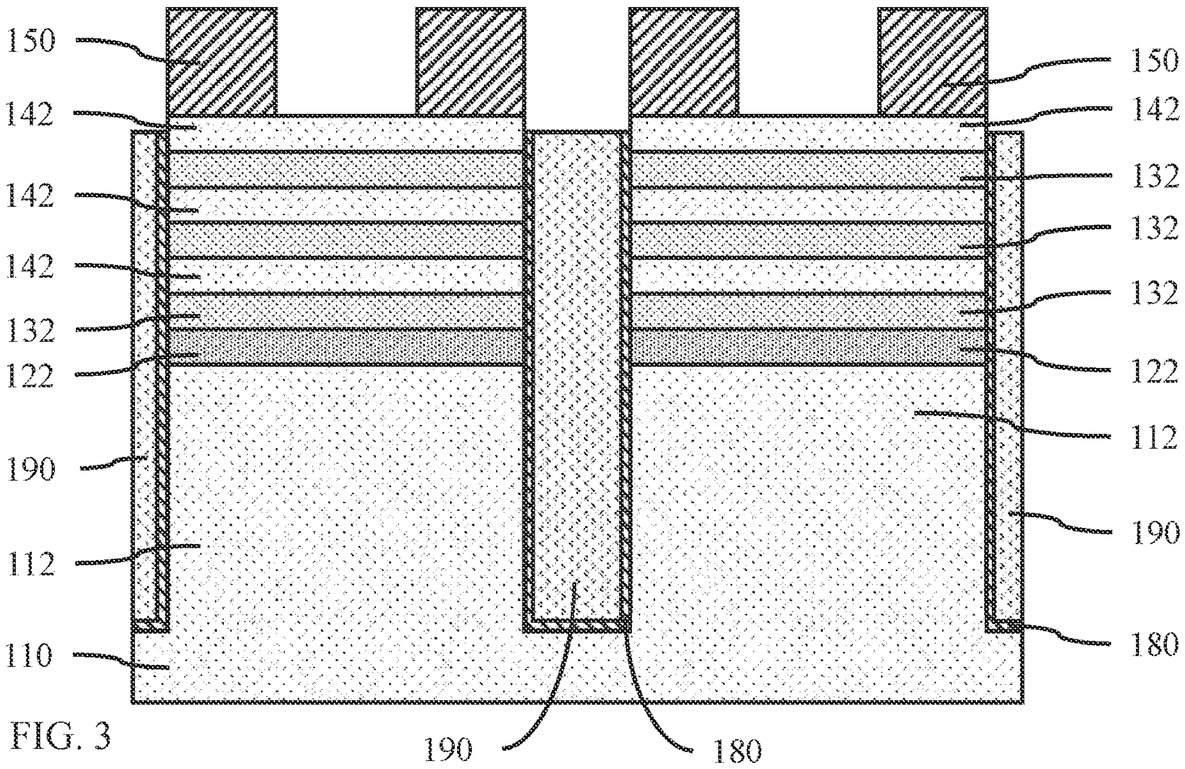
FIG. 3 is a cross-sectional side view showing an isolation region formed in the plurality of trenches adjacent to the nanosheet sections, sacrificial sections, and mesas, in accordance with an embodiment of the present invention.

FIG. 3 is a cross-sectional side view showing an isolation region formed in the plurality of trenches adjacent to the nanosheet sections, sacrificial sections, and mesas, in accordance with an embodiment of the present invention.

In one or more embodiments, the etch masks 160 can be removed to expose the surface of the top layer between the etch templates 150. The etch masks 160 can be removed through ashing an OPL or selectively etching a dielectric material.

In one or more embodiments, an isolation region can be formed in the plurality of trenches 170 adjacent to the nanosheet sections 142, sacrificial sections 132, and mesas 112, where the isolation region can include a trench liner 180 and a trench fill 190. In various embodiments, the trench liner 180 can be formed by a conformal deposition, for example, atomic layer deposition (ALD), plasma enhanced ALD (PEALD), or a combination thereof. In various embodiments, the trench fill 190 can be formed by a conformal deposition (e.g., ALD, PEALD), a blanket deposition (e.g., CVD, PECVD), or a combination thereof.

In various embodiments, the trench liner 180 can be made of silicon oxide (SiO), silicon nitride (SiN), silicon oxynitride (SiON), and combinations thereof. In various embodiments, the trench fill 190 can be made of silicon oxide (SiO), silicon nitride (SiN), silicon oxynitride (SiON), and combinations thereof. In various embodiments, the isolation trenches 170 can be filled with a single dielectric material to form the isolation region.

In various embodiments, portions of the trench fill 190 and trench liner 180 can be removed from the etch templates 150 and surface of the stack by chemical-mechanical polishing (CMP) and selective etching, where the trench fill 190 and trench liner 180 can be recessed below the top surface of the top layer, for example, the surface of the top nanosheet section 142.

In various embodiments, the trench liner 180 can have a thickness in a range of about 0.5 nm to about 10 nm, or about 2 nm to about 6 nm, although other thicknesses are also contemplated.

Figure 4:
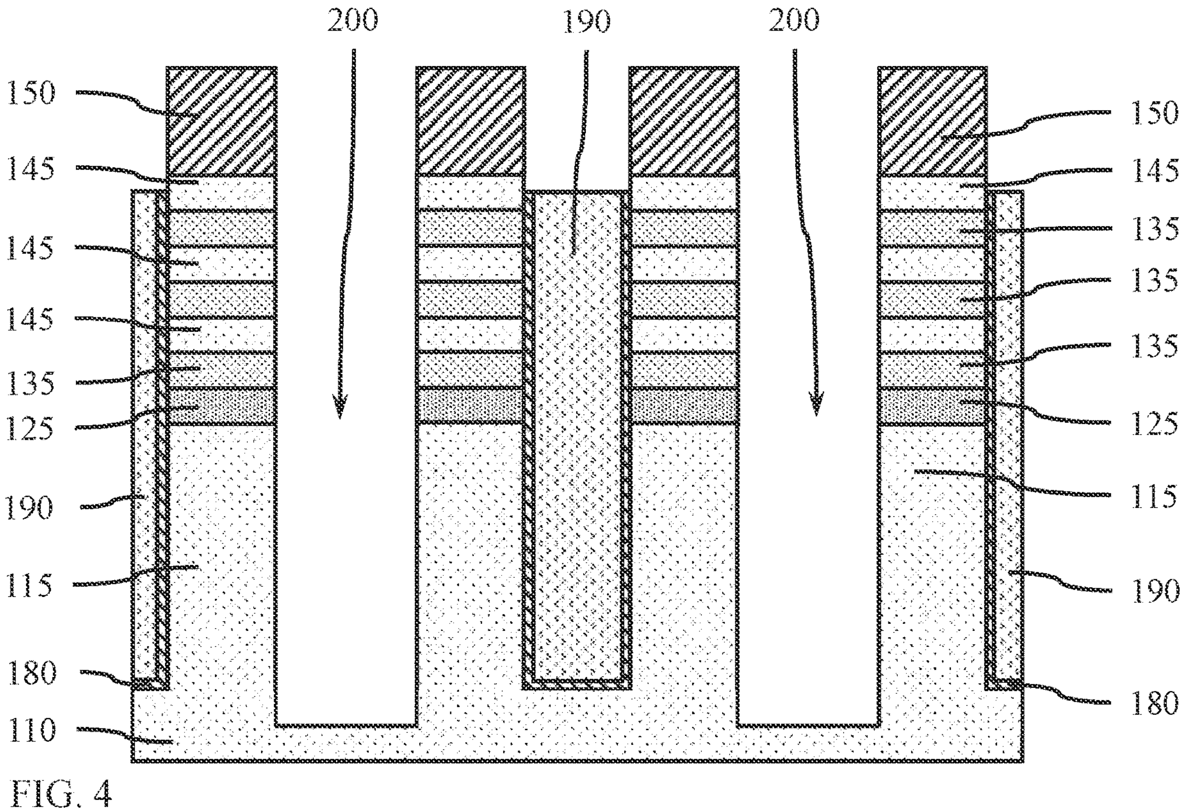
FIG. 4 is a cross-sectional side view showing a plurality of separation trenches through the nanosheet sections, sacrificial sections, and mesas to form a stack of alternating nanosheet channels and sacrificial segments on a support pillar, in accordance with an embodiment of the present invention.

FIG. 4 is a cross-sectional side view showing a plurality of separation trenches through the nanosheet sections, sacrificial sections, and mesas to form a stack of alternating nanosheet channels and sacrificial segments on a support pillar, in accordance with an embodiment of the present invention.

In one or more embodiments, one or more separation trenches 200 can be formed through each of the stacks of alternating nanosheet sections 142 and sacrificial sections 132, the first sacrificial section 122, and into the underlying substrate mesas 112 to form a stack of alternating nanosheet channels 145 and sacrificial segments 135 on a first sacrificial segment 125 and support pillar 115. The separation trenches 200 can be formed in the region between adjacent etch templates 150 that was previously covered by an etch mask 160, where the separation trenches 200 can be formed by a selective direction etch, for example, a reactive ion etch (RIE). Formation of the separation trenches 200 can expose the sidewalls of the nanosheet channels 145 and sacrificial segments 135, and the support pillars 115.

In various embodiments, the separation trenches 200 can extend a depth into the substrate 110 in a range of about 50 nm to about 200 nm, or about 40 nm to about 150 nm, or about 40 nm to about 200 nm, although other depths are also contemplated. In various embodiments, the separation trenches 200 can extend further into the substrate 110 than the adjacent isolation trenches 170, where the lengths of opposing sidewalls of the support pillars 115 can be different. The separation trenches 200 can have a width essentially equal to the distance between the etch templates 150 given the etching process and process tolerances.

Figure 5:
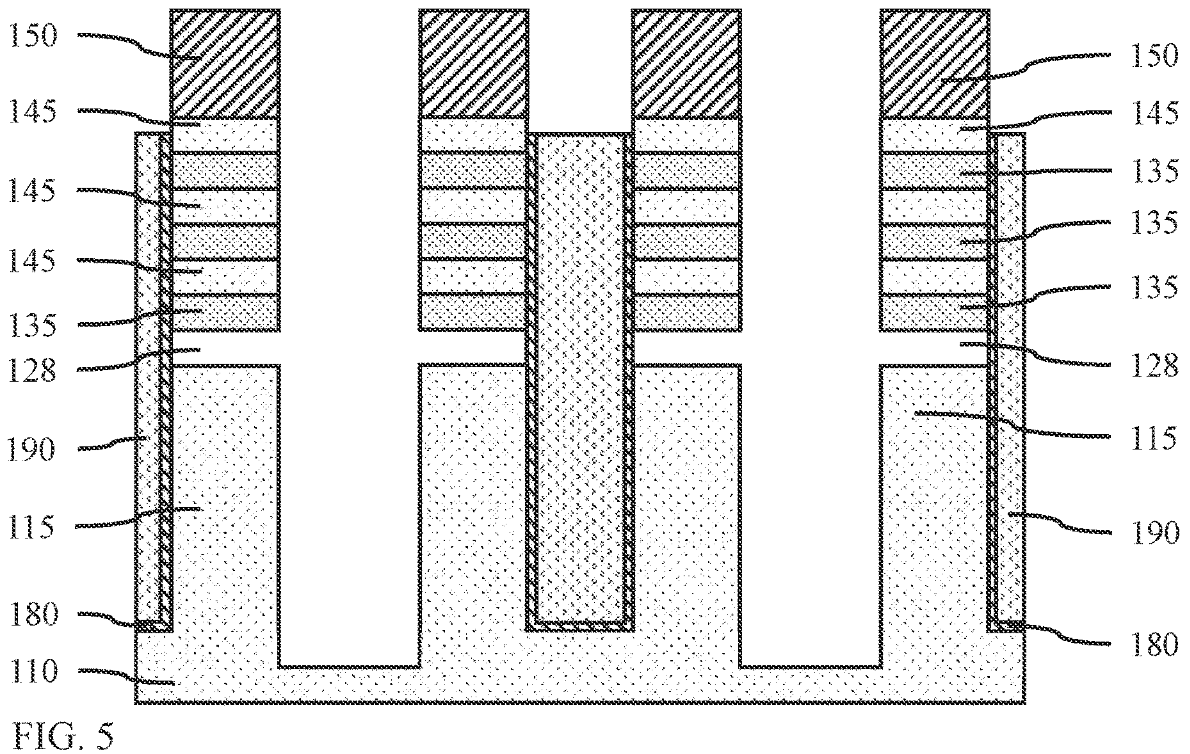
FIG. 5 is a cross-sectional side view showing removal of a first sacrificial segment from the stack of alternating nanosheet channels and sacrificial segments, in accordance with an embodiment of the present invention.

FIG. 5 is a cross-sectional side view showing removal of a first sacrificial segment from the stack of alternating nanosheet channels and sacrificial segments, in accordance with an embodiment of the present invention.

In one or more embodiments, a first sacrificial segment 125 can be removed from between the support pillars 115 and the stack of alternating nanosheet channels 145 and sacrificial segments 135, where the first sacrificial segment 125 can be removed through a selective isotropic etch, for example, a wet chemical etch, dry plasma etch, or combination thereof. Removal of the first sacrificial segment 125 from below each of the stacks can form a cavity between the substrate and the stack with a face of the cavity open to the separation trench 200. The cavity can have a height about the same as the thickness of the first sacrificial segment 125.

Figure 6:
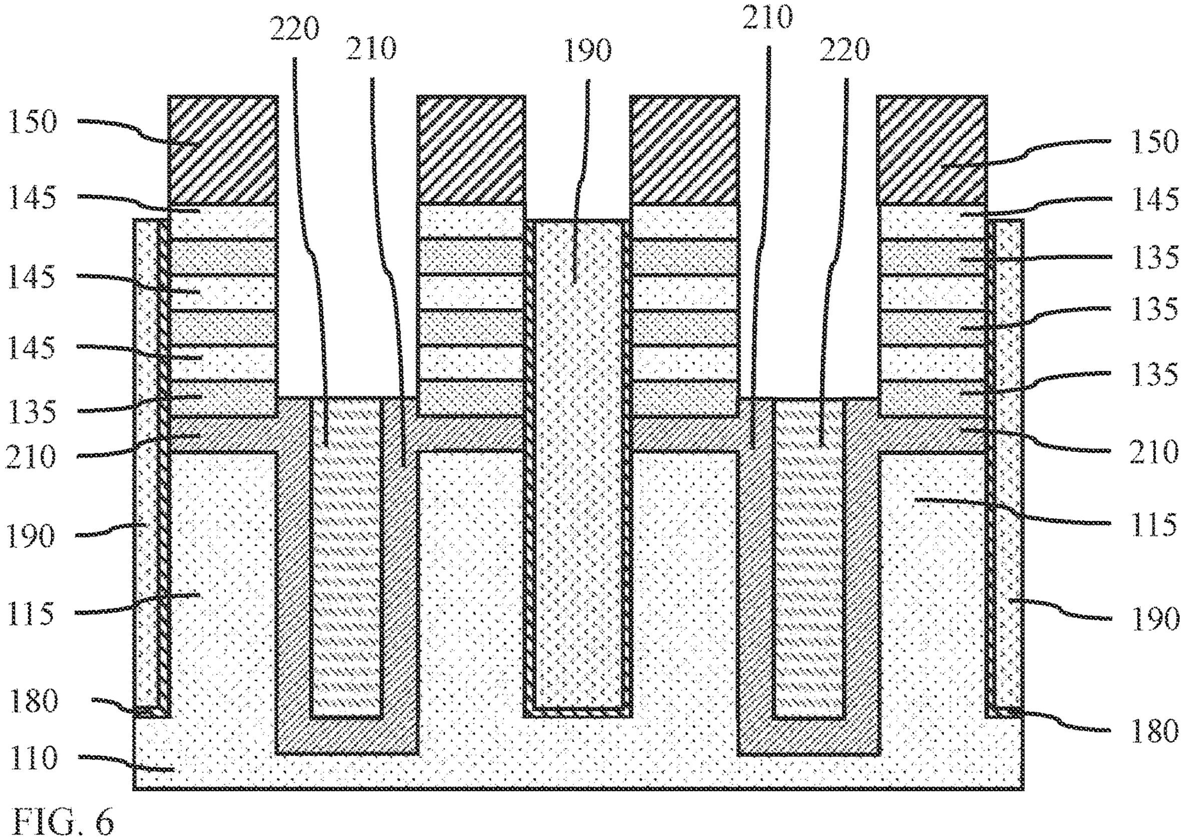
FIG. 6 is a cross-sectional side view showing formation of a protective liner in the cavity formed by removal of the first sacrificial segments and along the sidewalls of the separation trench, and a disposable fill on the protective liner, in accordance with an embodiment of the present invention.

FIG. 6 is a cross-sectional side view showing formation of a protective liner in the cavity formed by removal of the first sacrificial segments and along the sidewalls of the separation trench, and a disposable fill on the protective liner, in accordance with an embodiment of the present invention.

In one or more embodiments, a protective liner 210 can be formed in the cavity formed by removal of the first sacrificial segments 125 and along the sidewalls of the separation trench 200, where the protective liner 210 can be formed by a conformal deposition (e.g., ALD, PEALD). The protective liner 210 can cover the exposed surfaces of the support pillars 115 and the bottom surface of the separation trench 200.

In various embodiments, the protective liner 210 can be an electrically insulating dielectric material, including, but not limited to, silicon nitride (SiN), silicon carbide (SiC), silicon oxy carbide (SiOC), silicon oxy carbonitride (SiOCN), silicon boro carbonitride (SiBCN), and combinations thereof.

In various embodiments, the protective liner 210 can have a thickness in a range of about 3 nm to about 20 nm, or about 5 nm to about 10 nm, although other thicknesses are also contemplated. The protective liner 210 can have a thickness of about half the height of the cavity formed by removing the first sacrificial segments 125, where the protective liner 210 can fill in the cavity. In various embodiments, the liner thickness is at least half of the cavity height, although the protective liner 210 can be thicker.

In one or more embodiments, a disposable fill 220 can be formed on the protective liner 210 in the separation trenches 200, where the disposable fill 220 can be formed by a spin-on coating (e.g., OPL) to fill in the trench space between the sidewalls of the protective liner 210.

In various embodiments, the disposable fill 220 can be an OPL.

In various embodiments, the disposable fill 220 can be etched back below the bottom most nanosheet channel 145, followed by removing the exposed dielectric liner 210, to expose the sides of the nanosheet channels 145 and sacrificial segments 135, where the top surfaces of the disposable fill 220 and protective liner 210 can be between the top and bottom surfaces of the bottom layer, for example, the lower most sacrificial segment 135.

Figure 7:
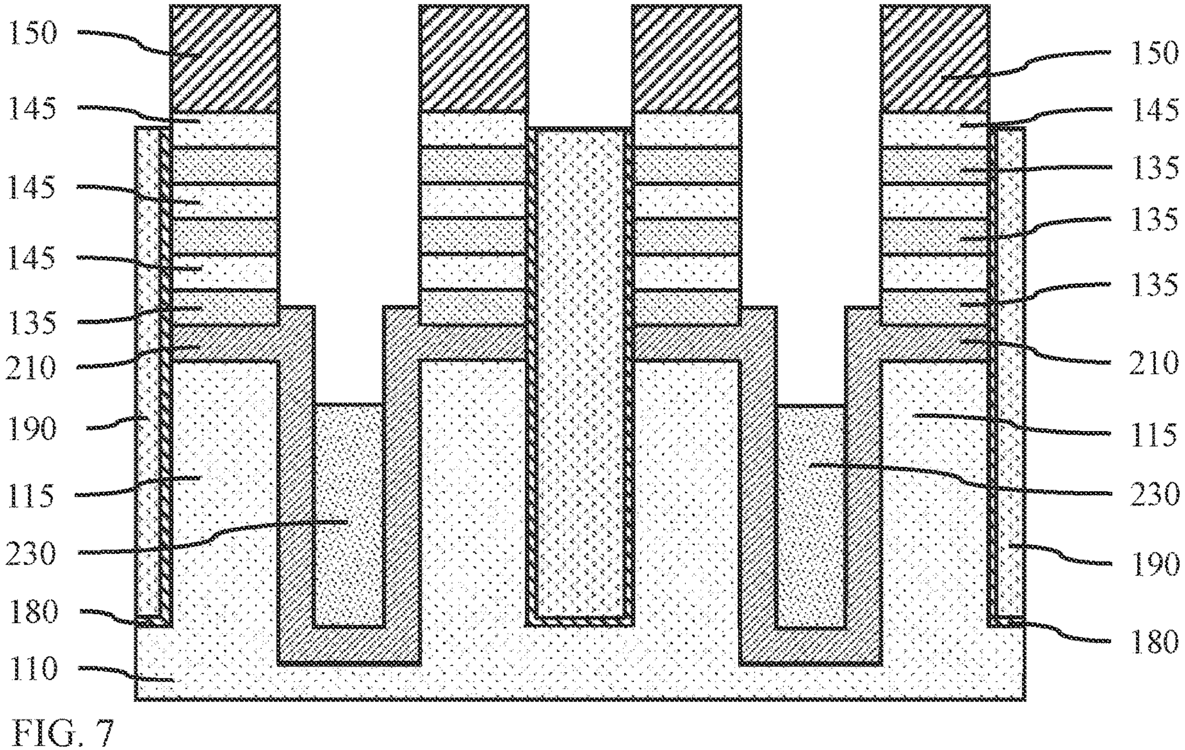
FIG. 7 is a cross-sectional side view showing replacement of the disposable fill with a buried power rail on the protective liner, in accordance with an embodiment of the present invention.

FIG. 7 is a cross-sectional side view showing replacement of the disposable fill with a buried power rail on the protective liner, in accordance with an embodiment of the present invention.

In one or more embodiments, the disposable fill 220 can be removed using a selective etch, for example, RIE, wet etch, dry plasma etch, or a combination thereof.

In one or more embodiments, a buried power rail 230 can be formed on the protective liner 210 in the space left by removing the disposable fill 220. A conductive material can be formed in the separation trenches 200 to form the buried power rail 230 can be formed on the protective liner 210, and the conductive material can be etched back to a predetermined height. The top surface of the conductive material can be below the bottom surface of the portion of the protective liner 210 formed in the cavities. The protective liner 210 can form a U-shaped channel around the buried power rail 230, where sidewalls of the protective liner 210 are on opposite sides of the buried power rail 230.

In various embodiments, the buried power rail 230 can be made of a conductive material, for example, a metal, including, but not limited to, tungsten (W), ruthenium (Ru), cobalt (Co), molybdenum (Mo), and combinations thereof. In various embodiments, a thin adhesion layer, for example, titanium nitride (TiN), tantalum nitride (TaN), etc., may be used.

Figure 8:
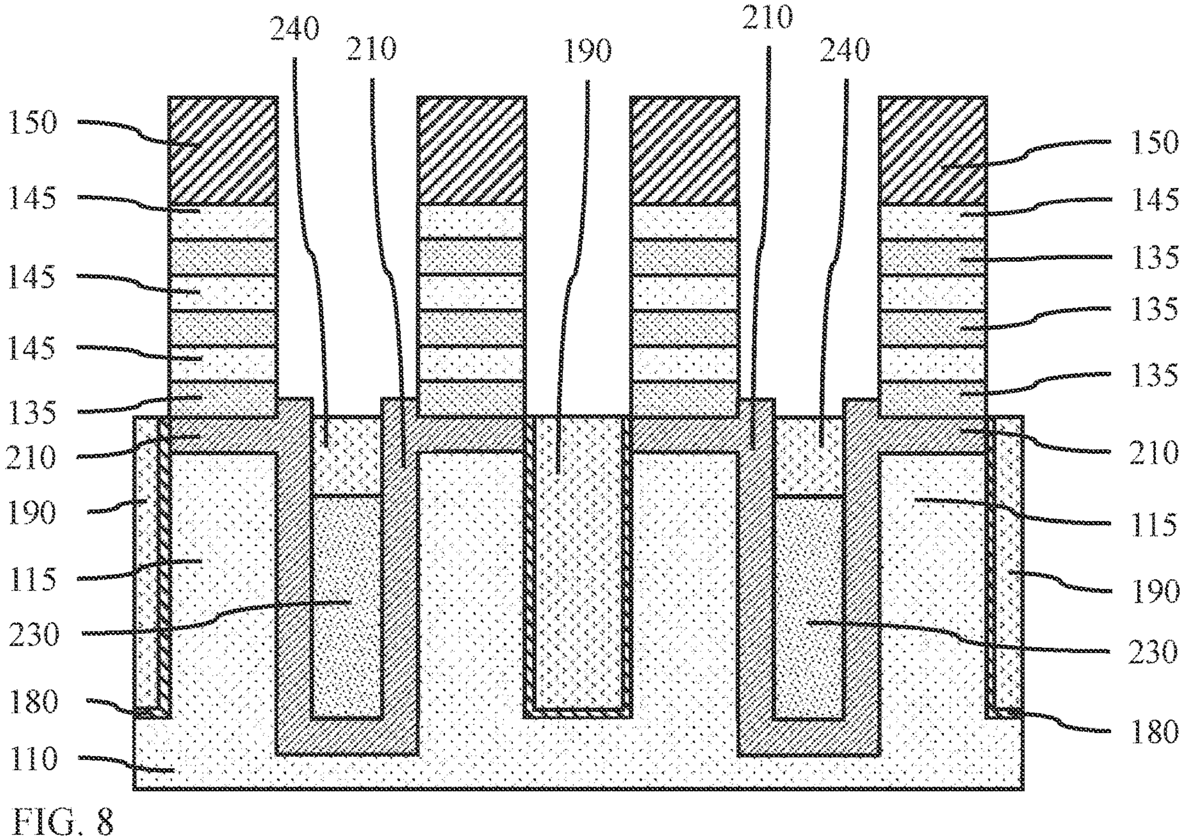
FIG. 8 is a cross-sectional side view showing formation of a power rail cap on the buried power rail and protective liner, in accordance with an embodiment of the present invention.

FIG. 8 is a cross-sectional side view showing formation of a power rail cap on the buried power rail and protective liner, in accordance with an embodiment of the present invention.

In one or more embodiments, a power rail cap 240 can be formed on the buried power rail 230 and protective liner 210. The power rail cap 240 can be an electrically insulating dielectric material that covers the buried power rail 230.

In various embodiments, the power rail cap 240 can be an electrically insulating dielectric material, including, but not limited to, silicon oxide (SiO), silicon nitride (SiN), silicon carbide (SiC), silicon oxy carbide (SiOC), silicon oxy carbonitride (SiOCN), and combinations thereof. The power rail cap 240 can be a different material from the protective liner 210. The power rail cap 240 can be the same material as trench fill 190. The power rail cap 240 can be formed by overfilling the dielectric material, followed by CMP to stop on the etch templates 150, followed by dielectric recess so the active nanosheet stack layers are revealed for device fabrication.

Figure 9:
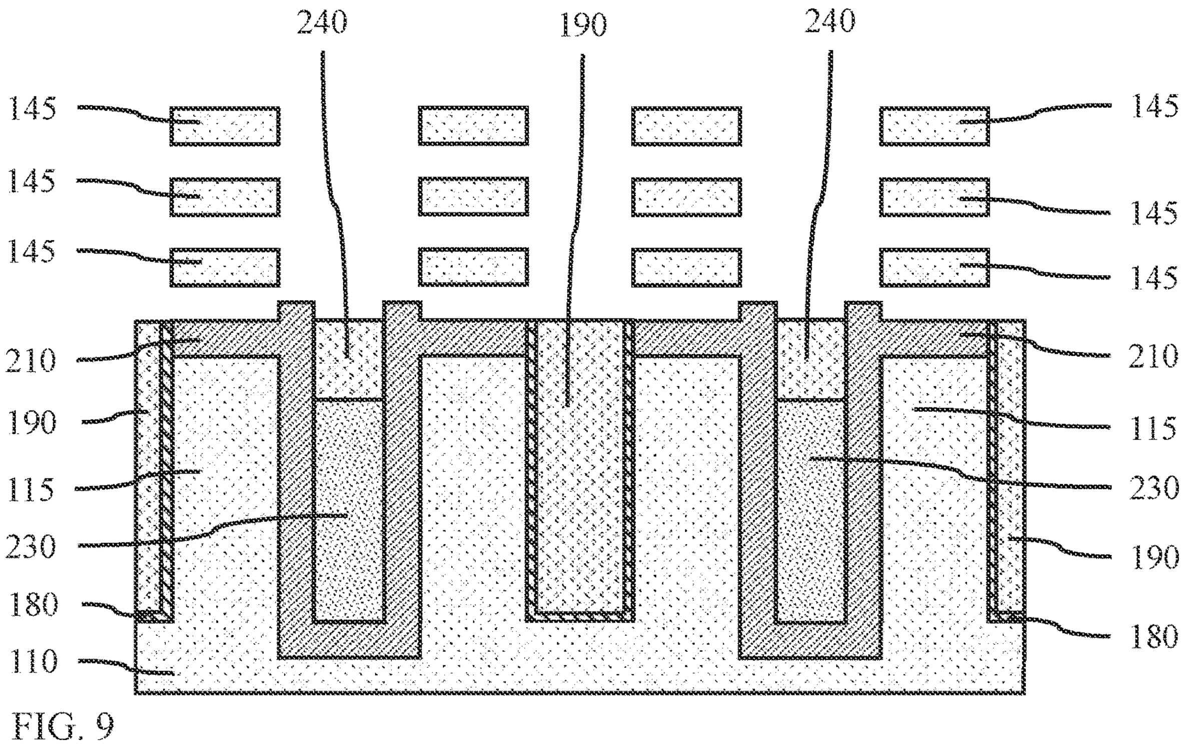
FIG. 9 is a cross-sectional side view showing removal of the sacrificial segments, in accordance with an embodiment of the present invention.

FIG. 9 is a cross-sectional side view showing removal of the sacrificial segments, in accordance with an embodiment of the present invention.

In one or more embodiments, additional process steps are done, including removing the etch templates 150, forming the sacrificial gate over the nanosheet stack, forming spacer, inner spacer, and S/D epi, followed by ILD formation and ILD CMP to exposed the sacrificial gate. After that, the sacrificial gates are removed, and the sacrificial segments 135 can be removed from between the nanosheet channels 145, where the sacrificial segments 135 can be removed using a selective isotropic etch (e.g., wet chemical etch, dry plasma etch). In various embodiments, removal of a bottom sacrificial segment 135 can expose the top surface of the protective liner 210 in the cavity.

Figure 10:
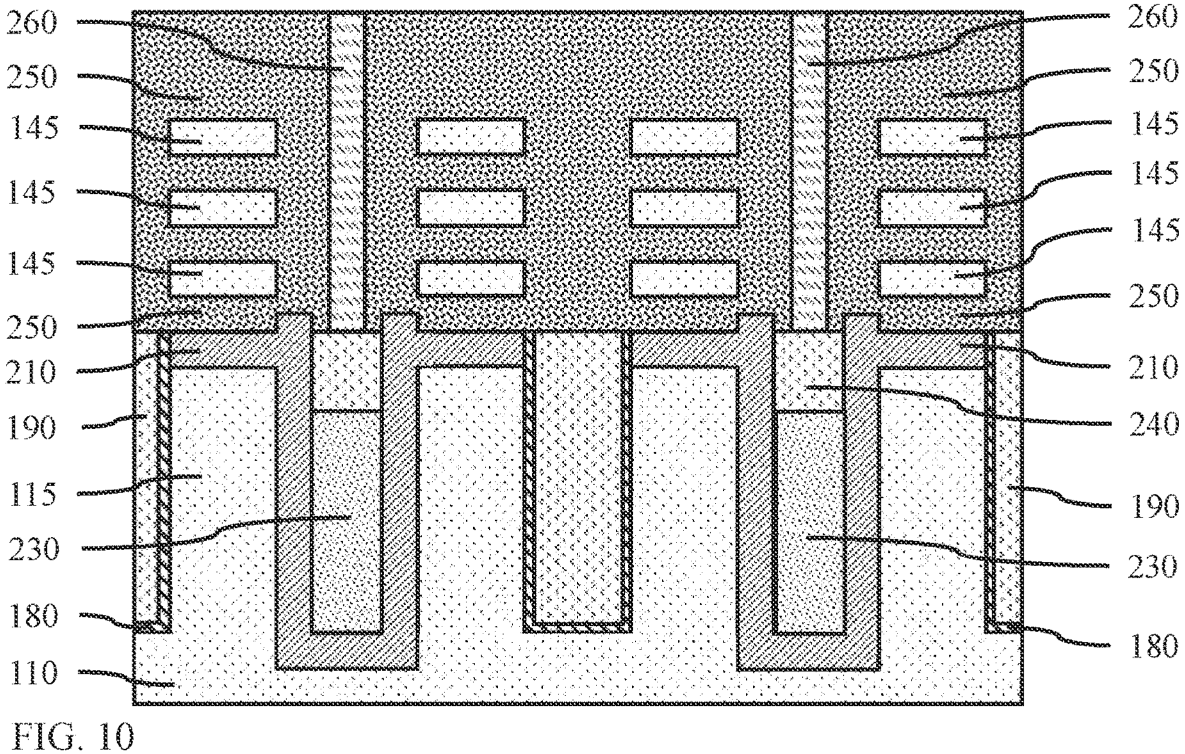
FIG. 10 is a cross-sectional side view showing formation of a gate structure on the nanosheet channels, and gate isolators between device regions, in accordance with an embodiment of the present invention.

FIG. 10 is a cross-sectional side view showing formation of a gate structure on the nanosheet channels, and gate isolators between device regions, in accordance with an embodiment of the present invention.

In one or more embodiments, a gate structure 250 can be formed on a portion of the nanosheet channels 145, where the gate structure 250 can be a gate all-around structure that fills in the spaces between the nanosheet channels 145. In various embodiments, the gate structures 250 can include a gate dielectric layer on the nanosheet channels 145, a work function material layer on the gate dielectric layer, and a conductive gate fill on the work function material layer.

In one or more embodiments, a portion of the gate structure can be removed from between adjacent stacks of the nanosheet channels 145 to form a trough. The gate structure can be removed down to the surface of the power rail caps 240.

In one or more embodiments, a gate cut slab 260 can be formed in the trough in the gate structure to form a plurality of electrically isolated gate structures on different stack(s) of nanosheet channels 145. In various embodiments, the gate cut slab 260 can be an electrically insulating dielectric material, including, but not limited to, silicon oxide (SiO), silicon nitride (SiN), silicon oxy nitride (SiON), silicon boronitride (SiBN), silicon carbo nitride (SiCN), silicon boro carbonitride (SiBCN), and combinations thereof.

Figure 11:
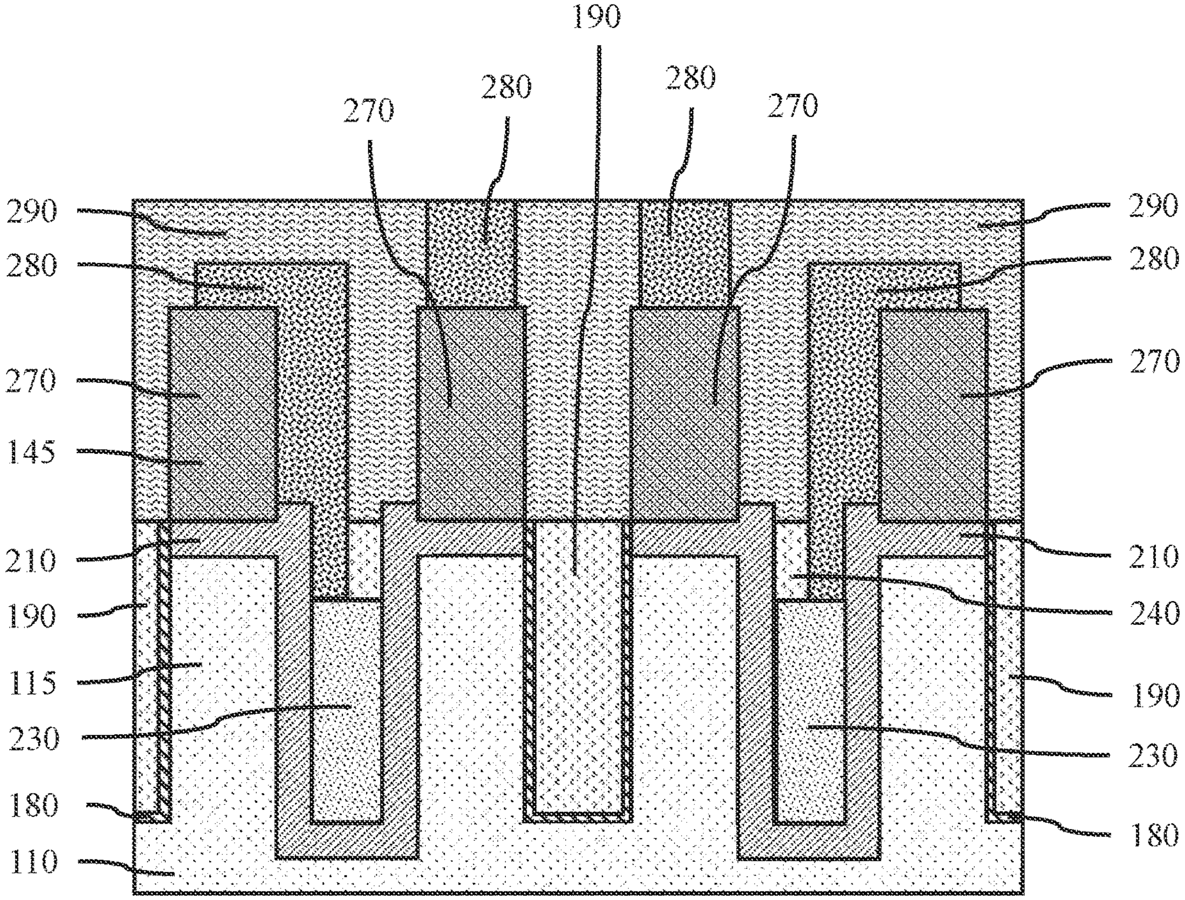
FIG. 11 is a cross-sectional side view showing formation of source/drains adjoining the nanosheet channels and adjacent to the gate structures, and source/drain contacts formed between the source/drain and the buried power rail, in accordance with an embodiment of the present invention.

FIG. 11 is a cross-sectional side view showing formation of source/drains adjoining the nanosheet channels and adjacent to the gate structures, and source/drain contacts formed between the source/drain and the buried power rail, in accordance with an embodiment of the present invention.

In one or more embodiments, source/drains 270 can be formed on the protective liner 210, such that the protective liner 210 electrically insulates the source/drains from the support pillar 115, substrate 110, and buried power rail 230. The source/drains 270 can be formed on the protective liner 210 by a lateral epitaxial growth from the exposed faces of the nanosheet channels 145, where a source/drain 270 can be formed on each of opposite sides of the nanosheet channels 145. The source/drains 270 on the protective liner 210 can be above and laterally offset from the buried power rail 230 with the protective liner 210 between the source/drain 270 and the buried power rail 230.

In various embodiments, the source/drains 270 on each of opposite sides of the nanosheet channels 145 can be doped to form an n-type or a p-type semiconductor transistor device.

In one or more embodiments, a dielectric cover layer 290 can be formed on the source/drains 270, where the dielectric cover layer 290 can be formed by a conformal deposition, a blanket deposition, or a combination thereof.

In various embodiments, the dielectric cover layer 290 can be made of silicon oxide (SiO), silicon nitride (SiN), or a combination thereof.

In one or more embodiments, a source/drain contact 280 can be formed in the dielectric cover layer 290 and between one of the source/drains 270 and the buried power rail 230, where a portion of the power rail cap 240 can be removed to allow electrical connection between the source/drain contact 280 and the buried power rail 230, such that the source/drain contact 280 passes through the power rail cap 240. In various embodiments, a source/drain contact 280 can be formed to the source/drains 270 of a transistor device without forming an electrical connection to the buried power rail 230.

Figure 12:
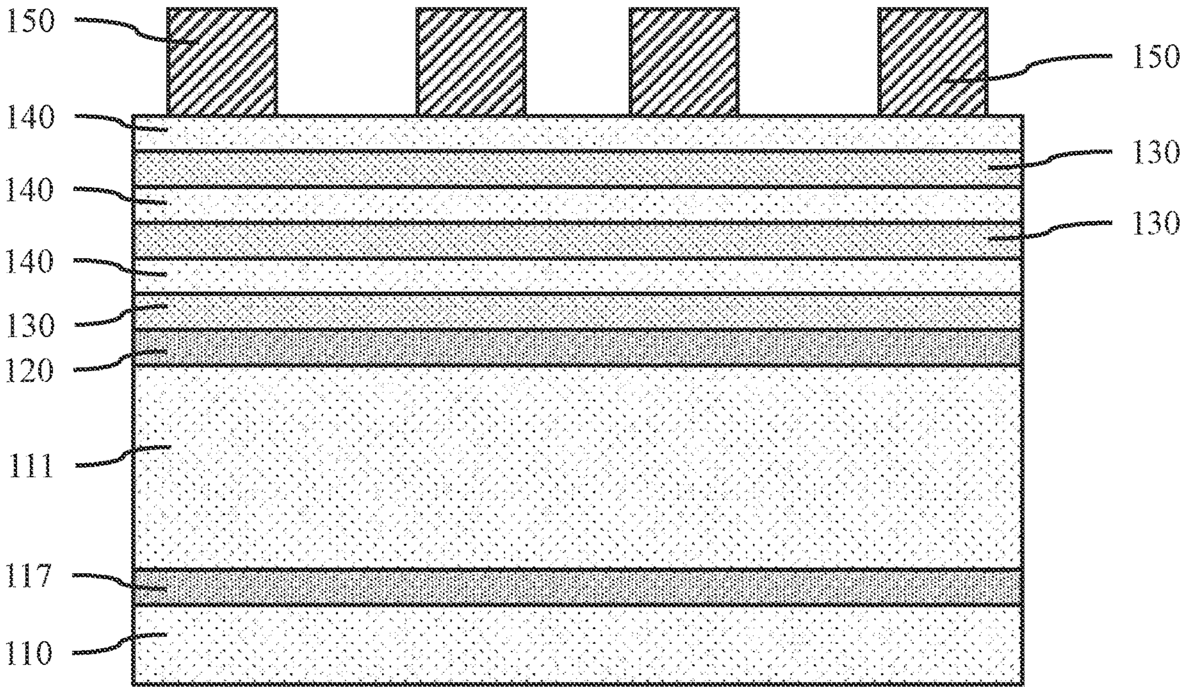
FIG. 12 is a cross-sectional side view showing a stack of alternating nanosheet layers and sacrificial layers on a substrate with a buried sacrificial layer, in accordance with an embodiment of the present invention.

FIG. 12 is a cross-sectional side view showing a stack of alternating nanosheet layers and sacrificial layers on a substrate with a buried sacrificial layer, in accordance with an embodiment of the present invention.

In various embodiments, a buried sacrificial layer 117 can be formed on the substrate 110, and a upper substrate layer 111 can be formed on the buried sacrificial layer 117, where the buried sacrificial layer 117 can be formed by epitaxial growth on the substrate, and the upper substrate layer 111 can be formed by epitaxial growth on the buried sacrificial layer 117. The upper substrate layer 111 can be the same semiconductor material as the substrate 110, or the upper substrate layer 111 can be a different semiconductor material from the substrate 110.

In one or more embodiments, a first sacrificial layer 120 can be formed on the upper substrate layer 111, where the first sacrificial layer 120 can be formed by epitaxial growth on the upper substrate layer 111. The first sacrificial layer 120 can be made of a material different from the upper substrate layer 111.

In one or more embodiments, a plurality of alternating nanosheet layers 140 and sacrificial layers 130 can be formed on the first sacrificial layer 120, where the alternating nanosheet layers 140 and sacrificial layers 130 can be formed by an epitaxial growth process on the surface of the first sacrificial layer 120. The nanosheet layers 140 can be the same semiconductor material as the substrate 110 and/or the upper substrate layer 111, or the nanosheet layers 140 can be a different semiconductor material from the substrate 110 and/or the upper substrate layer 111.

The first sacrificial layer 120 can be made of a material different from nanosheet layers 140 and sacrificial layers 130, where the first sacrificial layer 120 can be selectively removed relative to the nanosheet layers 140, the sacrificial layers 130, and the upper substrate layer 111. The first sacrificial layer 120 can be between the upper substrate layer 111 and the stack of alternating nanosheet layers 140 and sacrificial layers 130.

In various embodiments, the buried sacrificial layer 117 can be the same material as the first sacrificial layer 120, so the buried sacrificial layer 117 and the first sacrificial layer 120 can be removed using the same etch process.

In one or more embodiments, one or more etch templates 150 can be formed on the stack of alternating nanosheet layers 140 and sacrificial layers 130, where the etch templates 150 can be formed by lithographic and etching processes. The etch templates 150 can be patterned from a hardmask layer.

Figure 13:
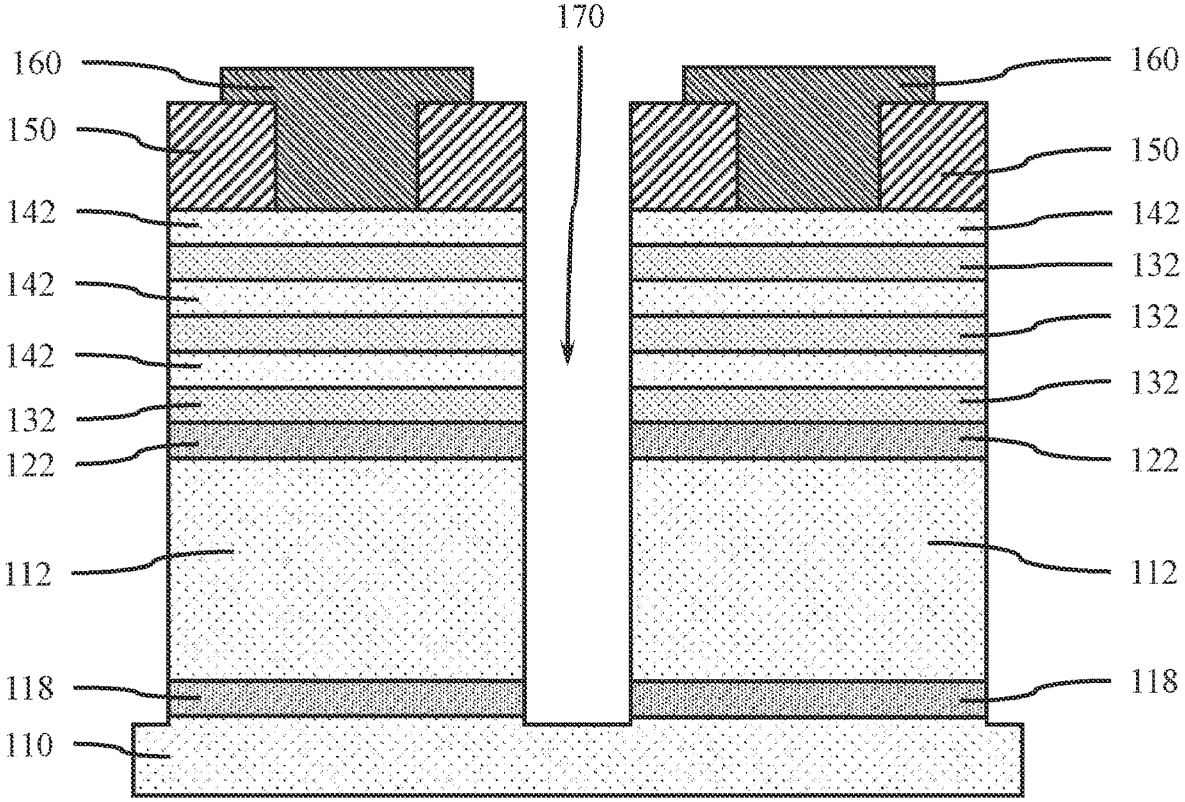
FIG. 13 is a cross-sectional side view showing formation of a plurality of isolation trenches that divide the stack layers and buried sacrificial layer into nanosheet sections and sacrificial sections on substrate mesas with a buried sacrificial section, in accordance with an embodiment of the present invention.

FIG. 13 is a cross-sectional side view showing formation of a plurality of isolation trenches that divide the stack layers and buried sacrificial layer into nanosheet sections and sacrificial sections on substrate mesas with a buried sacrificial section, in accordance with an embodiment of the present invention.

In one or more embodiments, an etch mask 160 can be formed on two or more etch templates 150, where the etch mask 160 can cover the portion of a top layer, for example, a top nanosheet layer 140 (although the top layer may also be a sacrificial layer 130) exposed between the two adjacent etch templates 150. The etch mask 160 can be formed by a blanket deposition, for example, a spin-on coating of an organic planarization layer (OPL) or other dielectric material resistant to etching.

In one or more embodiments, a plurality of isolation trenches 170 can be formed through the stack of alternating nanosheet layers 140 and sacrificial layers 130, a first sacrificial layer 120, the upper substrate layer 111, and the buried sacrificial layer 117 into the underlying substrate 110 to form a stack of alternating nanosheet sections 142 and sacrificial sections 132 on a first sacrificial section 122 and a substrate mesa 112, where a buried sacrificial section 118 is between the substrate mesa 112 and the underlying substrate 110. In various embodiments, a buried sacrificial section 118 is between a top and a bottom surface of each substrate mesa 112, where the isolation trenches 170 extend into the substrate 110. The isolation trenches 170 can be formed between adjacent etch templates 150 that are not covered by an etch mask 160, where the isolation trenches 170 can be formed by a selective direction etch, for example, a reactive ion etch (RIE). Formation of the isolation trenches 170 can expose the sidewalls of the nanosheet layers 140 and sacrificial layers 130, the substrate mesas 112, and the buried sacrificial sections 118.

In various embodiments, the isolation trenches 170 can extend a depth from the bottom surface of the first sacrificial section 122 in a range of about 70 nm to about 400 nm, or about 100 nm to about 250 nm, although other depths are also contemplated. The isolation trenches 170 can extend below the bottom surface of the buried sacrificial layer 117, so the sidewall faces of the buried sacrificial layer 117 are exposed. The isolation trenches 170 can have a width essentially equal to the distance between the etch templates 150 given the etching process and process tolerances.

Figure 14:
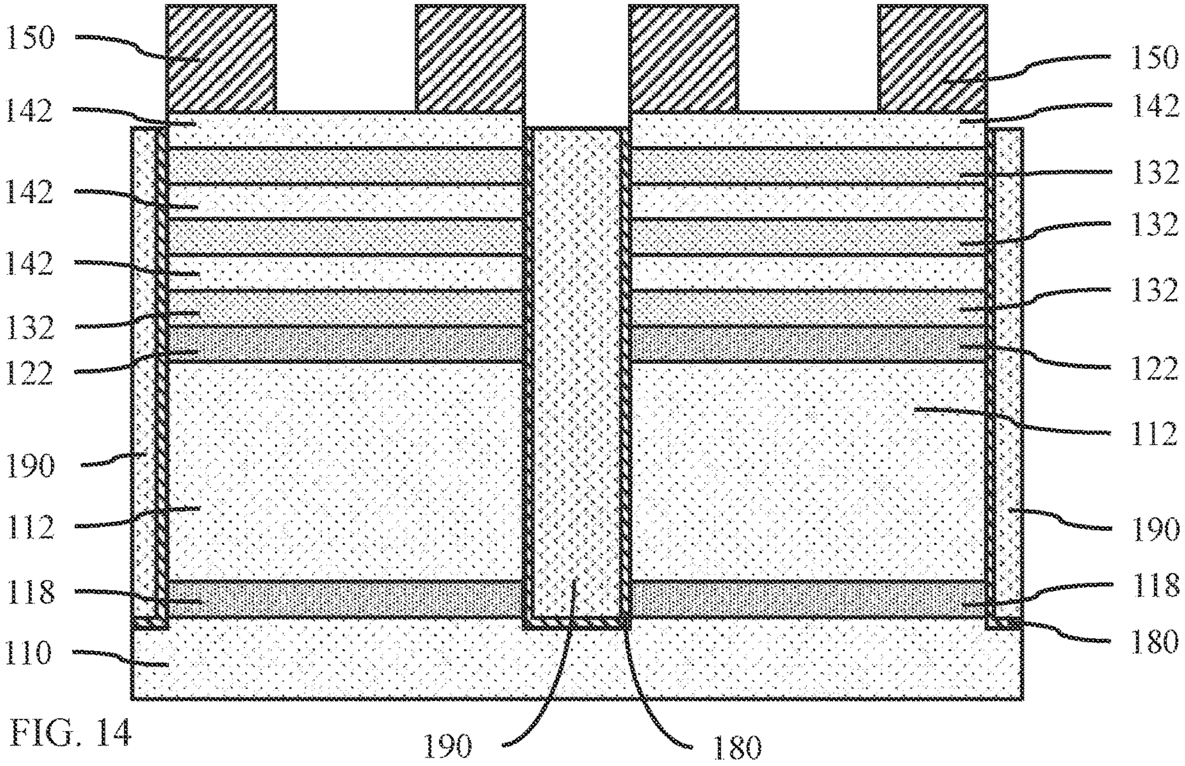
FIG. 14 is a cross-sectional side view showing an isolation region formed in the plurality of trenches adjacent to the nanosheet sections, sacrificial sections, mesas, and buried sacrificial sections, in accordance with an embodiment of the present invention.

FIG. 14 is a cross-sectional side view showing an isolation region formed in the plurality of trenches adjacent to the nanosheet sections, sacrificial sections, mesas, and buried sacrificial sections, in accordance with an embodiment of the present invention.

In one or more embodiments, an isolation region can be formed in the plurality of trenches 170 adjacent to the nanosheet sections 142, sacrificial sections 132, first sacrificial sections 122, substrate mesa 112, and buried sacrificial section 118, where the isolation region can include a trench liner 180 and a trench fill 190. In various embodiments, the trench liner 180 can be formed by a conformal deposition, for example, atomic layer deposition (ALD), plasma enhanced ALD (PEALD), or a combination thereof. In various embodiments, the trench fill 190 can be formed by a conformal deposition (e.g., ALD, PEALD), a blanket deposition (e.g., CVD, PECVD), or a combination thereof.

In various embodiments, the trench liner 180 can be made of silicon nitride (SiN), silicon oxynitride (SiON), and combinations thereof. In various embodiments, the trench fill 190 can be made of silicon oxide (SiO), silicon nitride (SiN), silicon oxynitride (SiON), and combinations thereof. In various embodiments, the isolation trenches 170 can be filled with a single dielectric material to form the isolation region.

In one or more embodiments, the etch masks 160 can be removed to expose the surface of the top layer between the etch templates 150. The etch masks 160 can be removed through ashing an OPL or selectively etching a dielectric material.

Figure 15:
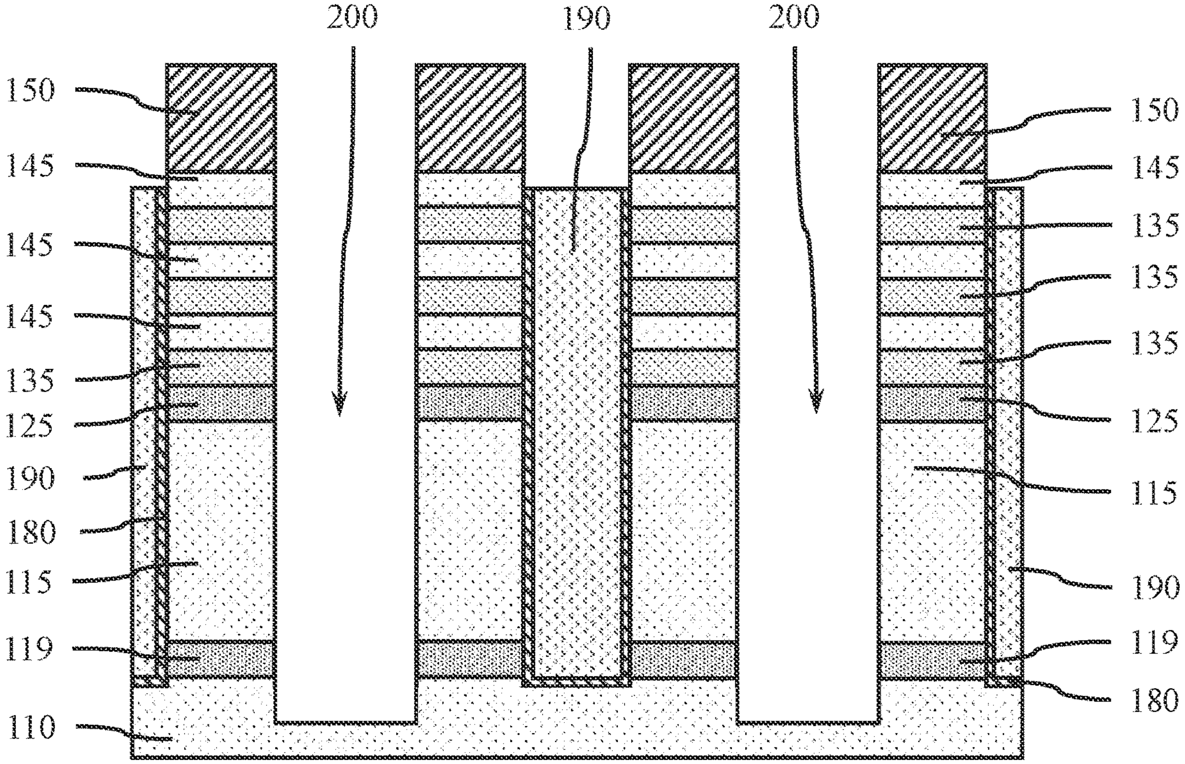
FIG. 15 is a cross-sectional side view showing a plurality of separation trenches formed through the nanosheet sections, sacrificial sections, buried sacrificial sections, and mesas to form a stack of alternating nanosheet channels and sacrificial segments on a support pillar with a sacrificial slab, in accordance with an embodiment of the present invention.

FIG. 15 is a cross-sectional side view showing a plurality of separation trenches formed through the nanosheet sections, sacrificial sections, buried sacrificial sections, and mesas to form a stack of alternating nanosheet channels and sacrificial segments on a support pillar with a sacrificial slab, in accordance with an embodiment of the present invention.

In one or more embodiments, one or more separation trenches 200 can be formed through each of the stacks of alternating nanosheet sections 142 and sacrificial sections 132, the first sacrificial section 122, through the underlying substrate mesas 112 and buried sacrificial section 118 to form a stack of alternating nanosheet channels 145 and sacrificial segments 135 on a first sacrificial segment 125, support pillar 115, and buried sacrificial segment 119. The separation trenches 200 can be formed in the region between adjacent etch templates 150 that was previously covered by an etch mask 160, where the separation trenches 200 can be formed by a selective direction etch, for example, a reactive ion etch (RIE). Formation of the separation trenches 200 can expose the sidewalls of the nanosheet channels 145 and sacrificial segments 135, first sacrificial segment 125, support pillar 115, and buried sacrificial segment 119.

In various embodiments, the separation trenches 200 can extend a depth into the substrate 110 in a range of about 70 nm to about 400 nm, or about 100 nm to about 250 nm, although other depths are also contemplated. In various embodiments, the separation trenches 200 can extend further into the substrate 110 than the adjacent isolation trenches 170, where the distance to the bottom surface of the trenches on opposite sides of the buried sacrificial segment 119 can be different. The separation trenches 200 can have a width essentially equal to the distance between the etch templates 150 given the etching process and process tolerances.

Figure 16:
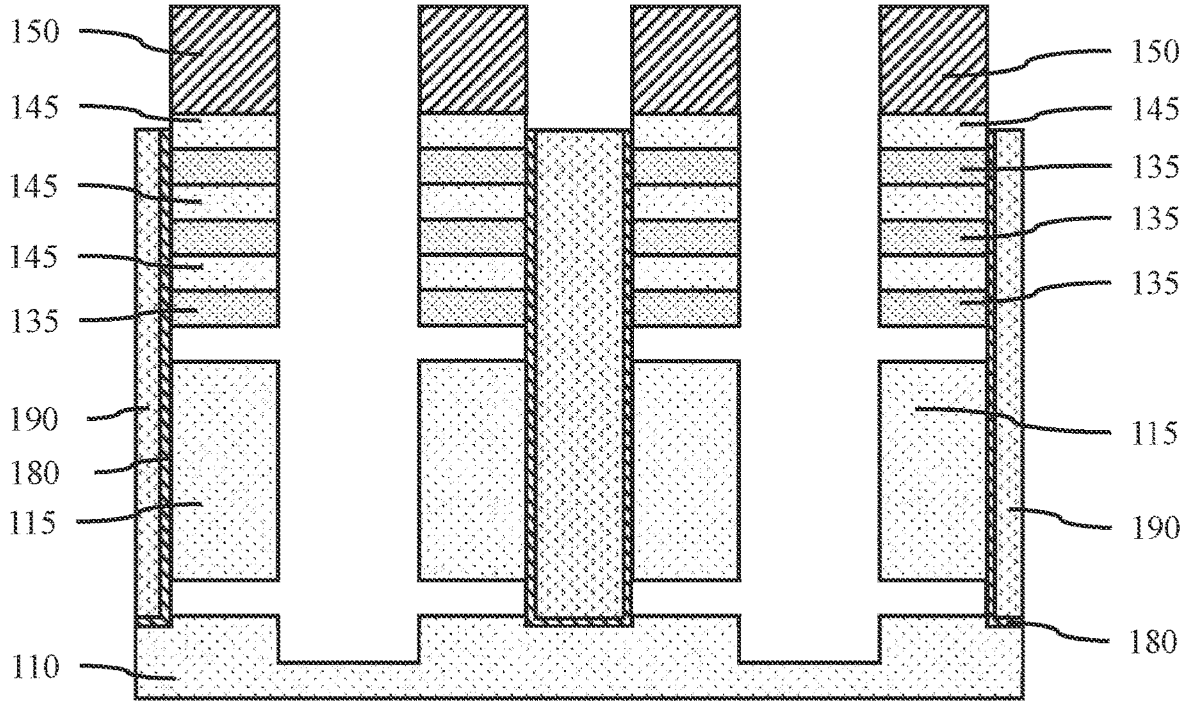
FIG. 16 is a cross-sectional side view showing removal of a first sacrificial segment from the stack of alternating nanosheet channels and sacrificial segments, and removal of the sacrificial slabs from the support pillars, in accordance with an embodiment of the present invention.

FIG. 16 is a cross-sectional side view showing removal of a first sacrificial segment from the stack of alternating nanosheet channels and sacrificial segments, and removal of the sacrificial slabs from the support pillars, in accordance with an embodiment of the present invention.

In one or more embodiments, the first sacrificial segment 125 and the buried sacrificial segment 119 can each be removed, where the first sacrificial segment 125 and the buried sacrificial segment 119 can be removed through a selective isotropic etch, for example, a wet chemical etch, dry plasma etch, or combination thereof. Removal of the first sacrificial segment 125 from below each of the stacks can form a cavity between the substrate and the stack with a face of the cavity open to the separation trench 200. The cavity can have a height about the same as the thickness of the first sacrificial segment 125. Removal of the buried sacrificial segment 119 can form a second cavity between the substrate 110 and the support pillar 115. Removal of the first sacrificial segment 125 and/or buried sacrificial segment 119 can expose portions of the trench liner 180 and/or trench fill 190.

Figure 17:
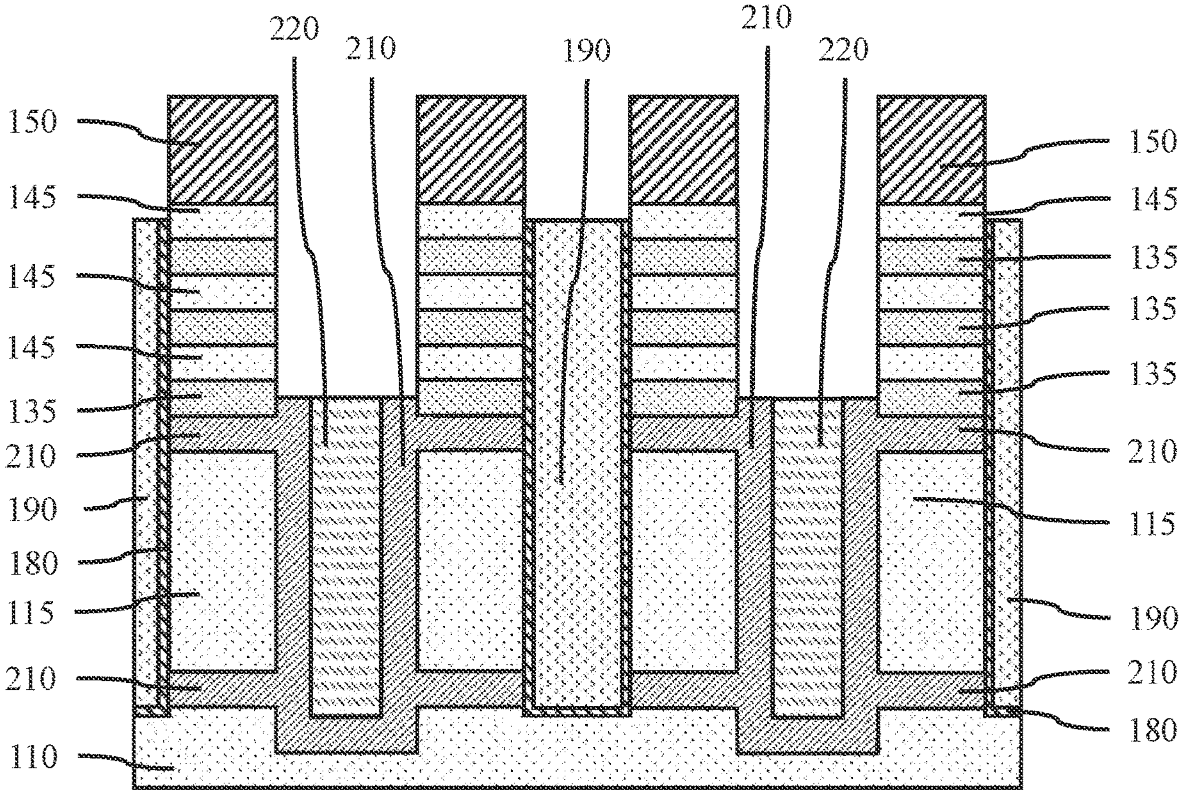
FIG. 17 is a cross-sectional side view showing formation of a protective liner in the gaps formed by removal of the first sacrificial segments and sacrificial slabs, and along the sidewalls of the support pillars, and a disposable fill on the protective liner, in accordance with an embodiment of the present invention.

FIG. 17 is a cross-sectional side view showing formation of a protective liner in the gaps formed by removal of the first sacrificial segments and sacrificial slabs, and along the sidewalls of the support pillars, and a disposable fill on the protective liner, in accordance with an embodiment of the present invention.

In one or more embodiments, a protective liner 210 can be formed in the first cavity formed by removal of the first sacrificial segments 125 and the second cavity formed by removal of the buried sacrificial segment 119, as well as along the sidewalls of the separation trench 200, where the protective liner 210 can be formed by a conformal deposition (e.g., ALD, PEALD). The protective liner 210 can cover the exposed surfaces of the support pillars 115 and the bottom surface of the separation trench 200.

In various embodiments, the protective liner 210 can be an electrically insulating dielectric material, including, but not limited to, silicon nitride (SiN), silicon carbide (SiC), silicon oxy carbide (SiOC), silicon oxy carbonitride (SiOCN), silicon boro carbonitride (SiBCN), and combinations thereof.

In various embodiments, the protective liner 210 can have a thickness in a range of about 2 nm to about 20 nm, or about 5 nm to about 10 nm, although other thicknesses are also contemplated. The protective liner 210 can have a thickness of about half the height of the cavity formed by removing the first sacrificial segments 125, where the protective liner 210 can fill in the cavity.

In one or more embodiments, a disposable fill 220 can be formed on the protective liner 210 in the separation trenches 200, where the disposable fill 220 can be formed by a spin-on coating (e.g., OPL) to fill in the trench space between the sidewalls of the protective liner 210.

In various embodiments, the disposable fill 220 can be an OPL.

In various embodiments, the disposable fill 220 and protective liner 210 can be etched back to expose the sides of the nanosheet channels 145 and sacrificial segments 135, where the top surfaces of the disposable fill 220 and protective liner 210 can be between the top and bottom surfaces of the bottom layer, for example, the lower most sacrificial segment 135.

Figure 18:
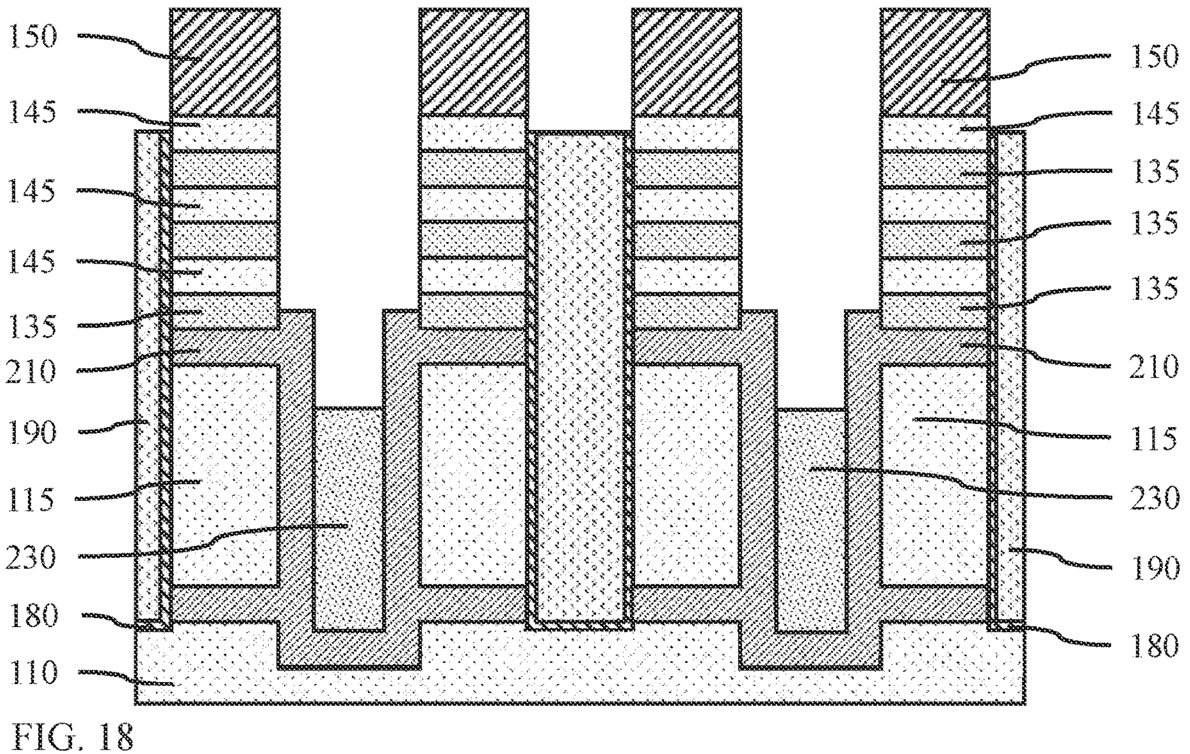
FIG. 18 is a cross-sectional side view showing replacement of the disposable fill with a buried power rail on the protective liner, in accordance with an embodiment of the present invention.

FIG. 18 is a cross-sectional side view showing replacement of the disposable fill with a buried power rail on the protective liner, in accordance with an embodiment of the present invention.

In one or more embodiments, the disposable fill 220 can be removed using a selective etch, for example, RIE, wet etch, dry plasma etch, or a combination thereof.

In one or more embodiments, a buried power rail 230 can be formed on the protective liner 210 in the space left by removing the disposable fill 220. A conductive material can be formed in the separation trenches 200 to form the buried power rail 230 can be formed on the protective liner 210, and the conductive material can be etched back to a predetermined height. The top surface of the conductive material can be below the bottom surface of the portion of the protective liner 210 formed in the cavities.

In various embodiments, the buried power rail 230 can be made of a conductive material, for example, a metal, including, but not limited to, tungsten (W), ruthenium (Ru), cobalt (Co), molybdenum (Mo), and combinations thereof. In various embodiments, a thin adhesion layer, for example, titanium nitride (TiN), tantalum nitride (TaN), etc., may be used.

Figure 19:
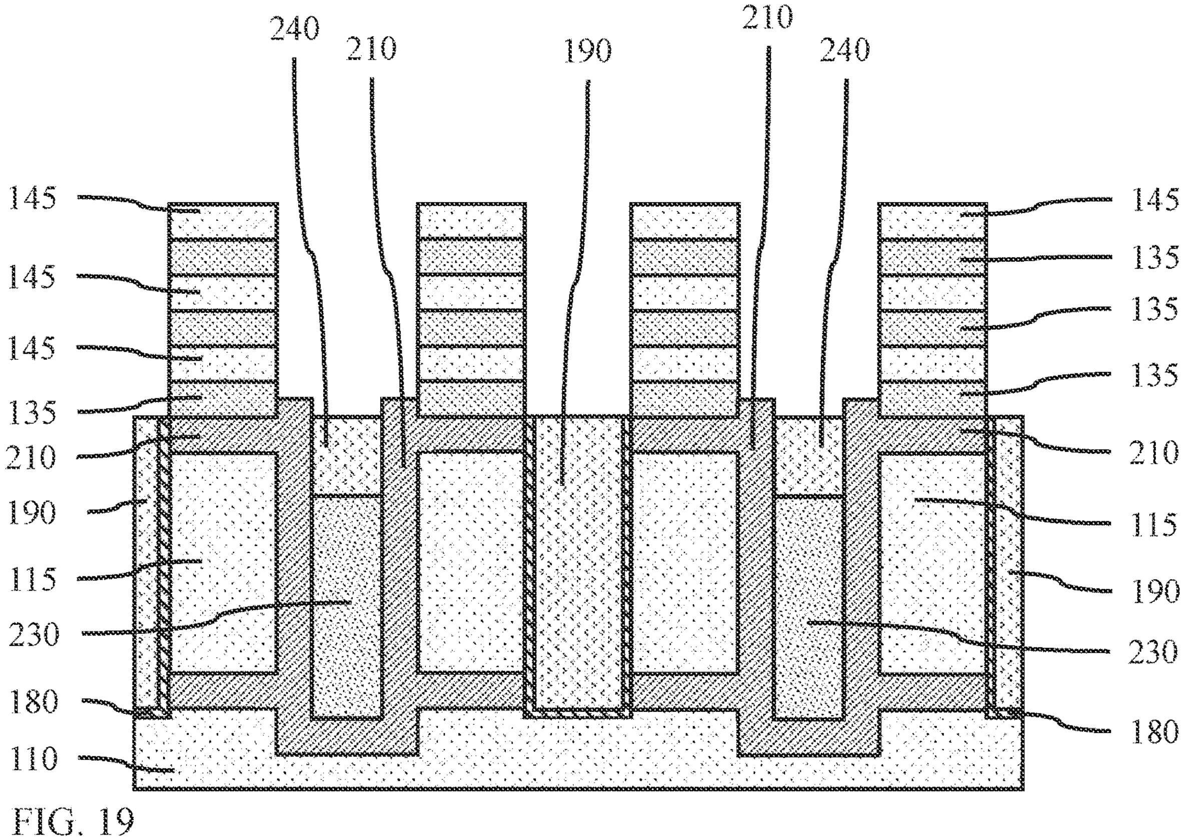
FIG. 19 is a cross-sectional side view showing removal of the nanosheet stack template and formation of a power rail cap on the buried power rail and protective liner, in accordance with an embodiment of the present invention.

FIG. 19 is a cross-sectional side view showing removal of the nanosheet stack template and formation of a power rail cap on the buried power rail and protective liner, in accordance with an embodiment of the present invention.

In one or more embodiments, a power rail cap 240 can be formed on the buried power rail 230 and protective liner 210. The power rail cap 240 can be an electrically insulating dielectric material that covers the buried power rail 230.

In various embodiments, the power rail cap 240 can be an electrically insulating dielectric material, including, but not limited to, silicon oxide (SiO), silicon nitride (SiN), silicon carbide (SiC), silicon oxy carbide (SiOC), silicon oxy carbonitride (SiOCN), and combinations thereof. The power rail cap 240 can be a different material from the protective liner 210. The power rail cap can be the same dielectric material as trench fill 190. It can be formed by overfilling the dielectric, followed by CMP and dielectric recess. After that, the nanosheet stack template (hardmask) can be removed.

Figure 20:
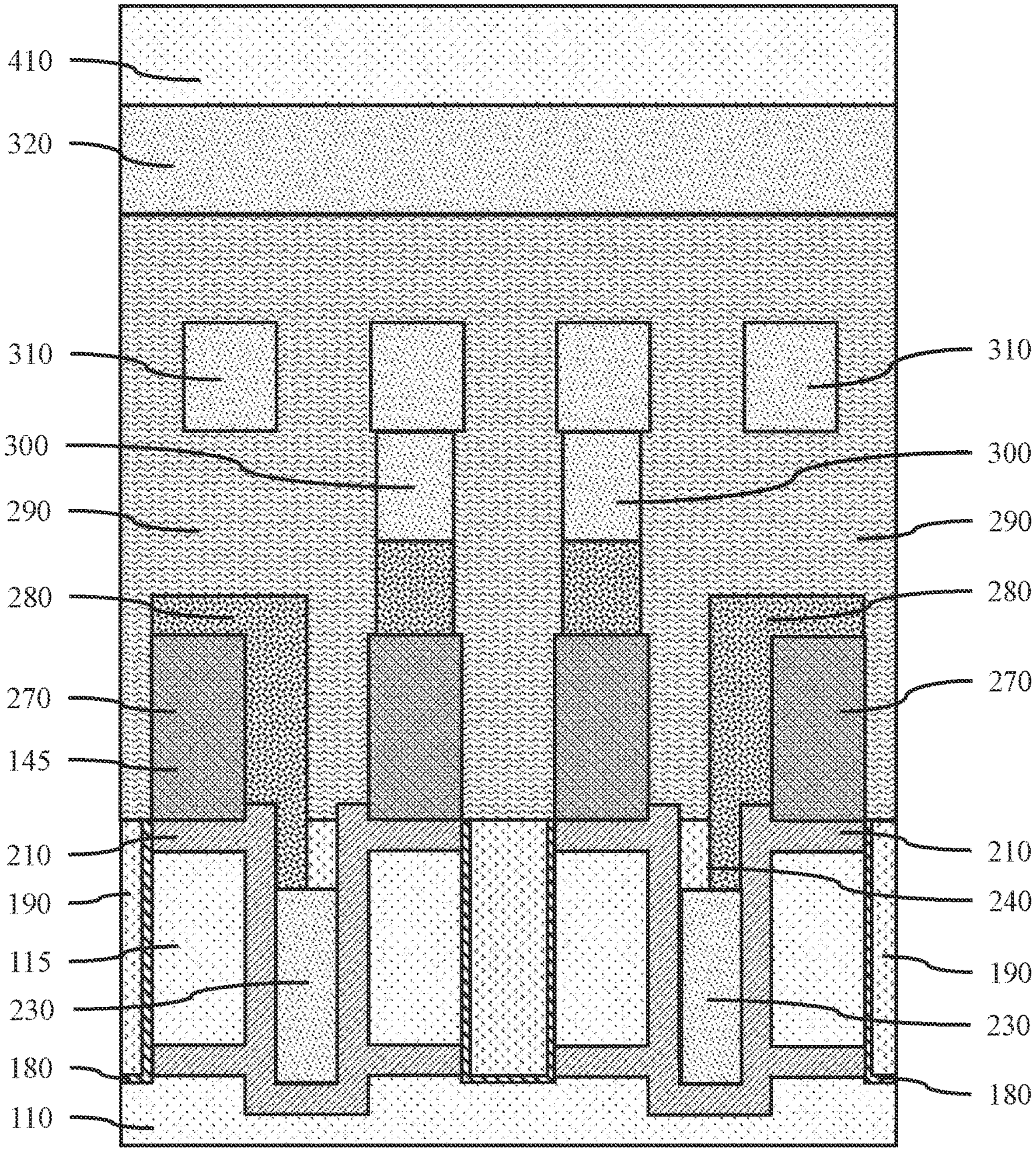
FIG. 20 is a cross-sectional side view showing formation of source/drains adjoining the nanosheet channels and adjacent to the gate structures, source/drain contacts formed between the source/drain and the buried power rail, and metallization layers formed on the source/drain contacts, in accordance with an embodiment of the present invention.

FIG. 20 is a cross-sectional side view showing formation of source/drains adjoining the nanosheet channels and adjacent to the gate structures, source/drain contacts formed between the source/drain and the buried power rail, and metallization layers formed on the source/drain contacts, in accordance with an embodiment of the present invention.

In one or more embodiments, source/drains 270 can be formed on the protective liner 210, such that the protective liner 210 electrically insulates the source/drains from the support pillar 115, substrate 110, and buried power rail 230. The source/drains 270 can be formed on the protective liner 210 by a lateral epitaxial growth from the exposed faces of the nanosheet channels 145, where a source/drain 270 can be formed on each of opposite sides of the nanosheet channels 145.

In various embodiments, the source/drains 270 on each of opposite sides of the nanosheet channels 145 can be doped to form an n-type or a p-type semiconductor transistor device.

In one or more embodiments, a dielectric cover layer 290 can be formed on the source/drains 270, where the dielectric cover layer 290 can be formed by a conformal deposition, a blanket deposition, or a combination thereof.

In one or more embodiments, a source/drain contact 280 can be formed in the dielectric cover layer 290 and between one of the source/drains 270 and the buried power rail 230, where a portion of the power rail cap 240 can be removed to allow electrical connection between the source/drain contact 280 and the buried power rail 230. In various embodiments, a source/drain contact 280 can be formed to the source/drains 270 of a transistor device without forming an electrical connection to the buried power rail 230.

In one or more embodiments, one or more source/drain vias 300 can be formed in the dielectric cover layer 290, where the source/drain vias 300 can be formed on the source/drain contact(s) 280 that are not electrically connected to the buried power rail 230.

In various embodiments, one or more first level metal lines 310 can be formed in the dielectric cover layer 290, where the first level metal lines 310 can be in electrical communication with one or more of the source/drain vias 300. The one or more first level metal lines 310 and one or more source/drain vias 300 can form a first metallization layer in the dielectric cover layer 290. The dielectric cover layer 290 can be with different dielectrics with different dielectric constant between the MOL contacts 280 and first level metal lines 310 of BEOL interconnects (e.g. in the MOL, the ILD layer is $SiO_2$ based with dielectric constant 3.9, and in the BEOL, the ILD layer is low-k dielectric with dielectric constant less than 3.9).

In various embodiments, one or more second level metal lines 320 can be formed over the dielectric cover layer 290 and M1 lines 310, where the second level metal lines 320 can form one or more metallization layer(s) above (e.g. more than 10 levels of BEOL interconnects). After that, a carrier wafer 410 is bonded to the upper surface of the BEOL layer to facilitate the wafer flipping and backside processing.

Figure 21:
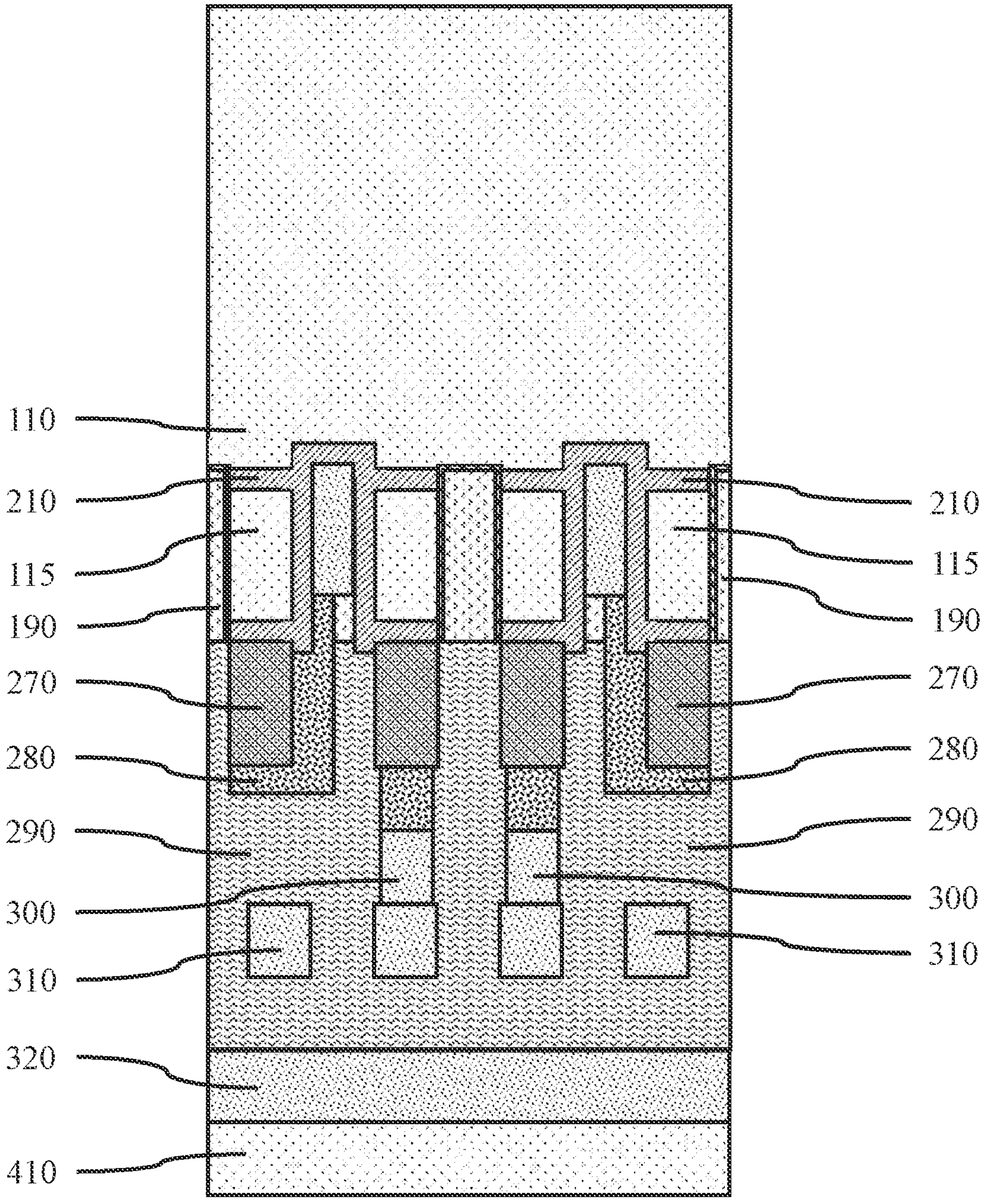
FIG. 21 is a cross-sectional side view showing devices and metallization layers flipped, in accordance with an embodiment of the present invention.

FIG. 21 is a cross-sectional side view showing devices and metallization layers flipped, in accordance with an embodiment of the present invention.

In one or more embodiments, the substrate 110, devices, dielectric cover layer 290, and metallization layers 300, 310 can be flipped to allow access to the bottom surface of the substrate 110. In various embodiments, a carrier wafer 410 is attached to the upper surface of the BEOL by wafer bonding process and serves as handler wafer for the wafer flipping. In various embodiments, the carrier wafer 410 can be a semiconductor wafer. The backside of the substrate 110 is ready for further processing.

Figure 22:
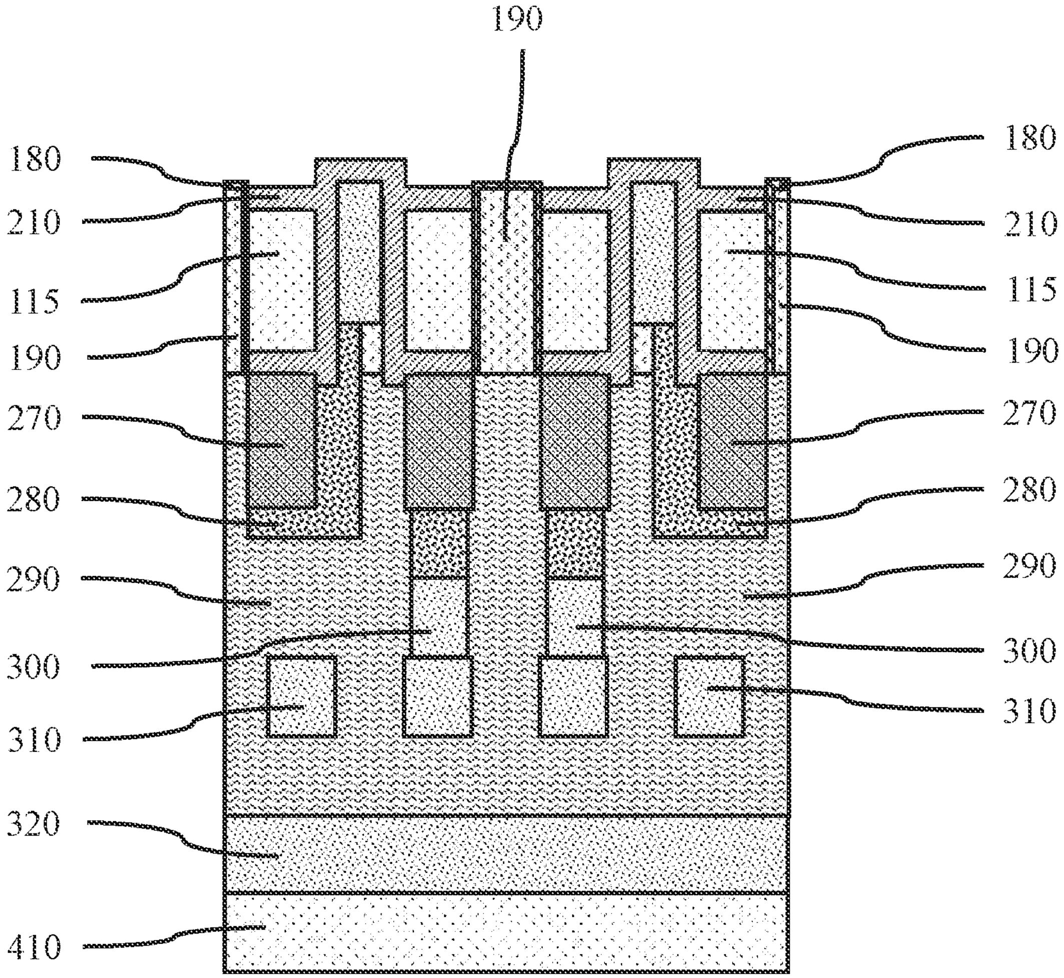
FIG. 22 is a cross-sectional side view showing removal of the substrate to expose the protective liner, in accordance with an embodiment of the present invention.

FIG. 22 is a cross-sectional side view showing removal of the substrate to expose the protective liner, in accordance with an embodiment of the present invention.

In one or more embodiments, the substrate 110 can be removed to expose a bottom surface of the protective liner 210 and trench liner 180. The substrate 110 can be removed using grinding, CMP (wet or dry), etching, or a combination thereof. The presence of the protective liner 210 and the trench liner 180 can provide a reference level with etch-stop properties that can provide an etch-stop surface, so that substrate removal process(es) won't damage the frontside devices.

Figure 23:
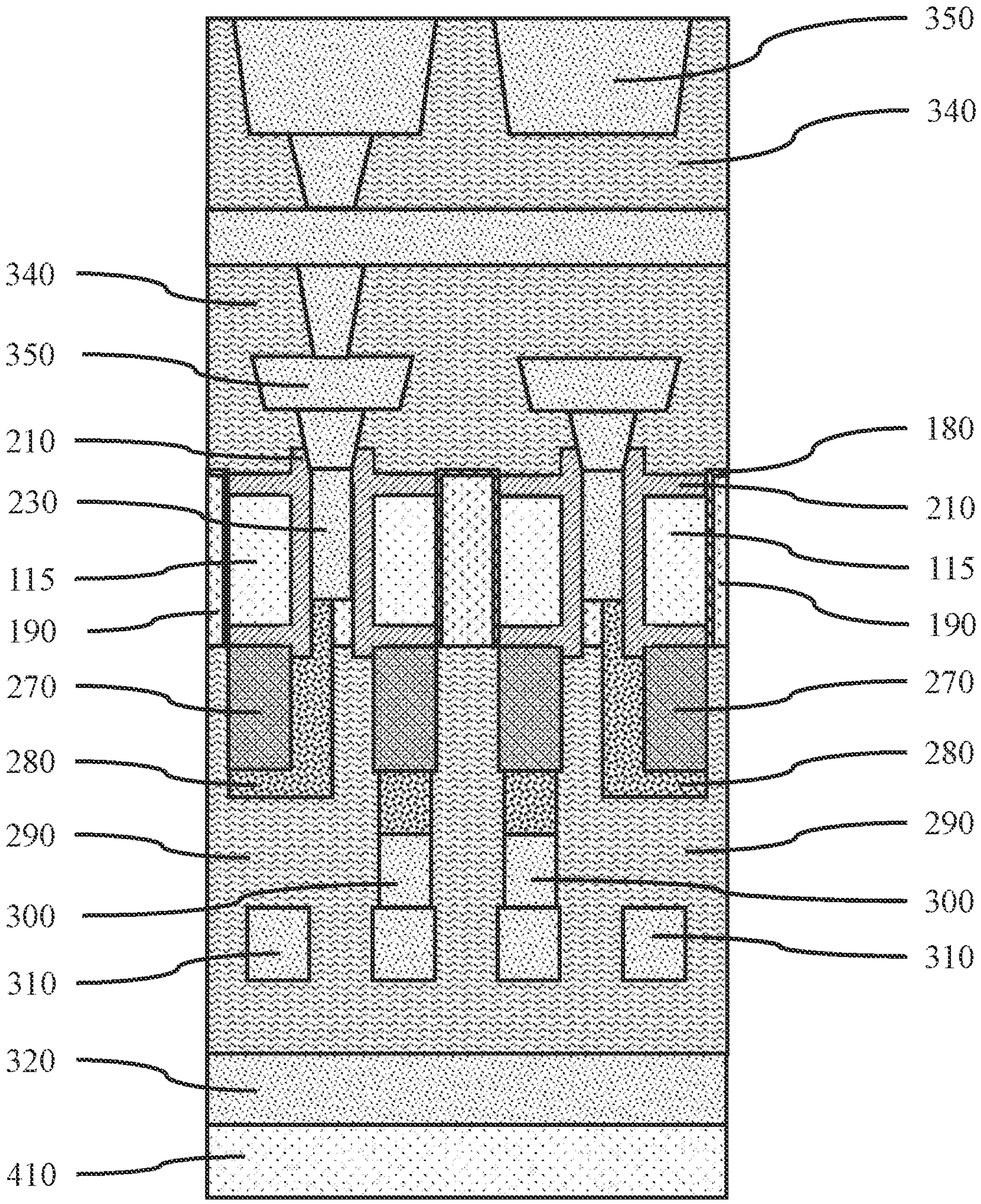
FIG. 23 is a cross-sectional side view showing formation of a backside interlayer dielectric (BILD) layer on the protective liner and semiconductor devices, and back-side interconnect features formed in the BILD layer, in accordance with an embodiment of the present invention.

FIG. 23 is a cross-sectional side view showing formation of a backside interlayer dielectric (BILD) layer on the protective liner and semiconductor devices, and back-side interconnect features formed in the BILD layer, in accordance with an embodiment of the present invention.

In one or more embodiments, an backside interlayer dielectric (BILD) layer 340 can be formed on the protective liner 210 and the trench liner 180, where the BILD layer 340 can be formed by a blanket deposition (e.g., CVD, PECVD).

In one or more embodiments, the backside interconnect 350 can be formed with lithography and etching process, followed by metallization, such as Cu metallization. A backside interconnect 350 can be formed in the BILD to wire the buried power rail 230 to backside power supplies.

Figure 24:
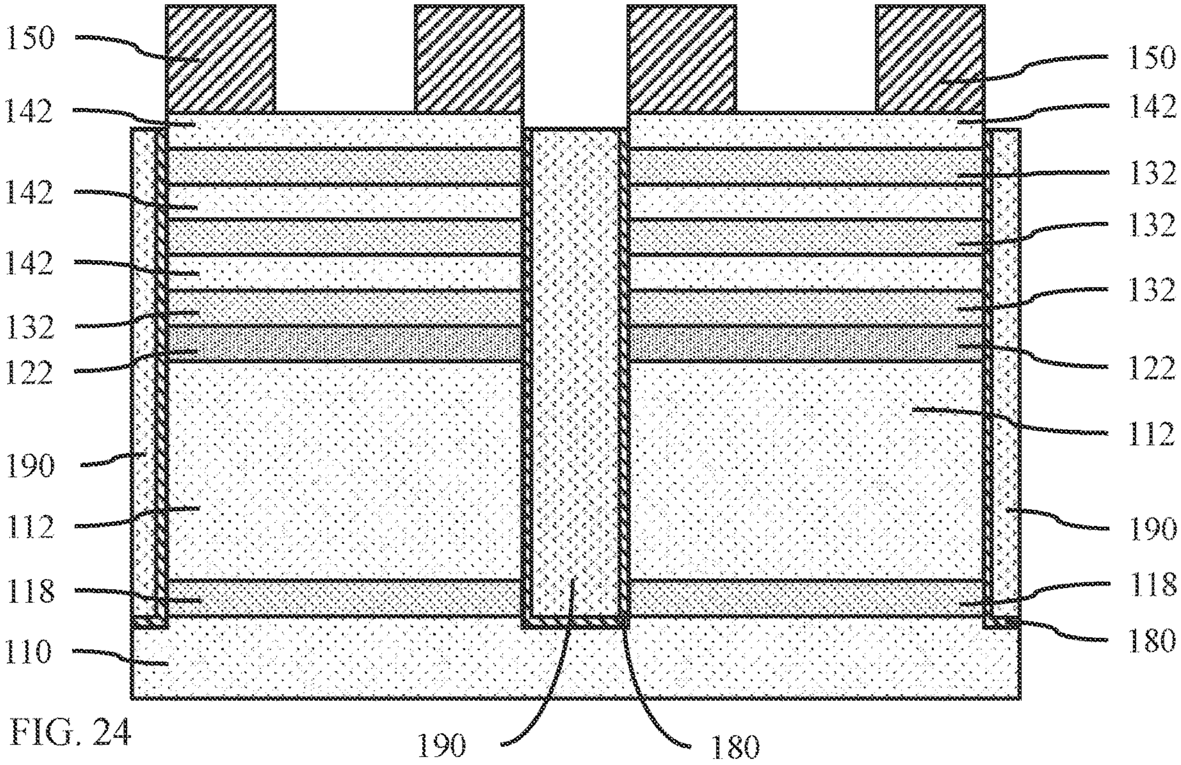
FIG. 24 is a cross-sectional side view showing an isolation region formed in the plurality of trenches adjacent to the nanosheet sections, sacrificial sections, mesas, and buried sacrificial sections, in accordance with an embodiment of the present invention.

FIG. 24 is a cross-sectional side view showing an isolation region formed in the plurality of trenches adjacent to the nanosheet sections, sacrificial sections, mesas, and buried sacrificial sections, in accordance with an embodiment of the present invention.

In various embodiments, the buried sacrificial layer 117 can be the same material as the sacrificial layers 130, so the buried sacrificial layer 117 can be selectively removed relative to the and the first sacrificial layer 120.

In one or more embodiments, one or more etch templates 150 can be formed on the stack of alternating nanosheet layers 140 and sacrificial layers 130, where the etch templates 150 can be formed by lithographic and etching processes. The etch templates 150 can be patterned from a hardmask layer.

Figure 25:
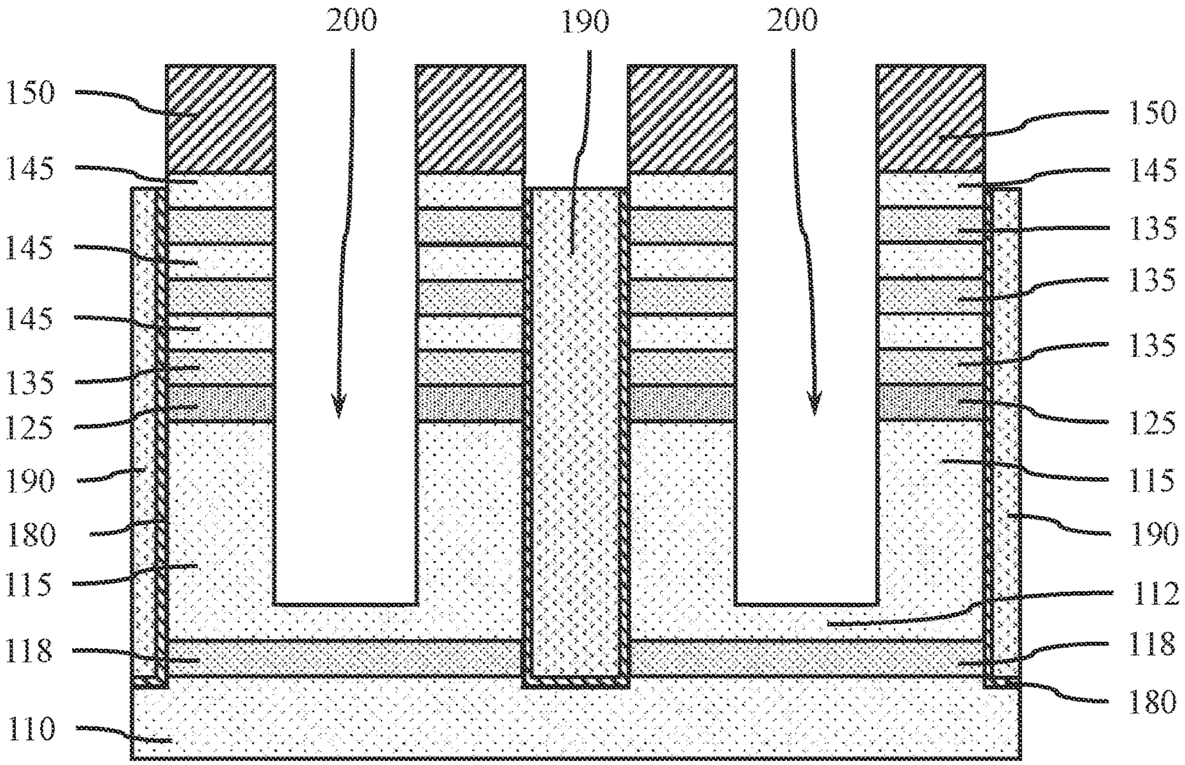
FIG. 25 is a cross-sectional side view showing a plurality of separation trenches formed through the nanosheet sections, sacrificial sections, and a portion of the mesas to form a stack of alternating nanosheet channels and sacrificial segments on a support pillar with a sacrificial section below the support pillars, in accordance with an embodiment of the present invention.

FIG. 25 is a cross-sectional side view showing a plurality of separation trenches formed through the nanosheet sections, sacrificial sections, and a portion of the mesas to form a stack of alternating nanosheet channels and sacrificial segments on a support pillar with a sacrificial section below the support pillars, in accordance with an embodiment of the present invention.

In one or more embodiments, one or more separation trenches 200 can be formed through each of the stacks of alternating nanosheet sections 142 and sacrificial sections 132, the first sacrificial section 122, through the underlying substrate mesas 112 to form a stack of alternating nanosheet channels 145 and sacrificial segments 135 on a first sacrificial segment 125, and support pillar 115. The separation trenches 200 can stop before reaching the and buried sacrificial section 118. The separation trenches 200 can be formed in the region between adjacent etch templates 150 that was previously covered by an etch mask 160, where the separation trenches 200 can be formed by a selective direction etch, for example, a reactive ion etch (RIE). Formation of the separation trenches 200 can expose the sidewalls of the nanosheet channels 145 and sacrificial segments 135, first sacrificial segment 125, and support pillar 115. The support pillars 115 can be on and joined by a portion of the substrate mesa 112 between the bottom of the separation trench 200 and the buried sacrificial section 118.

In various embodiments, the separation trenches 200 can extend a depth into the substrate 110 in a range of about 50 nm to about 400 nm, or about 100 nm to about 250 nm, although other depths are also contemplated. In various embodiments, the separation trenches 200 can extend further into the substrate 110 than the adjacent isolation trenches 170, where the distance to the bottom surface of the trenches on opposite sides of the buried sacrificial segment 119 can be different. The separation trenches 200 can have a width essentially equal to the distance between the etch templates 150 given the etching process and process tolerances.

Figure 26:
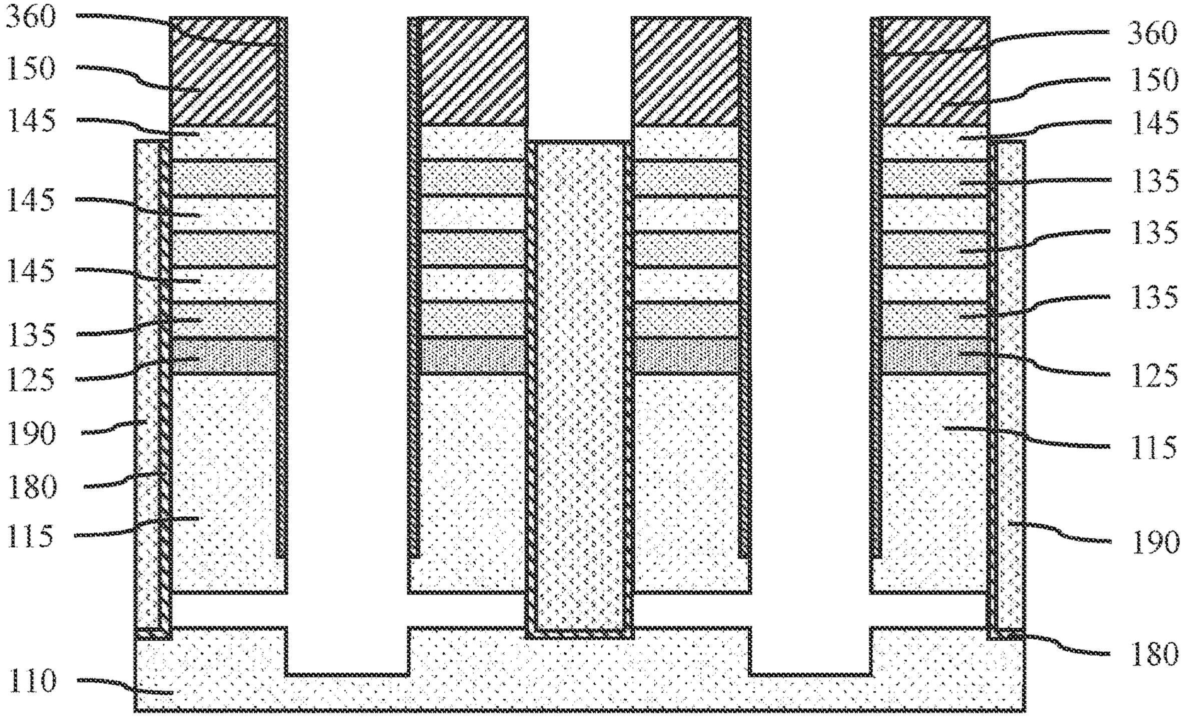
FIG. 26 is a cross-sectional side view showing formation of a shield layer on the sidewalls of the stack of alternating nanosheet channels, sacrificial segments, and support pillars, extension of the separation trenches through the buried sacrificial sections to form buried sacrificial segments, and removal of the buried sacrificial segments from the support pillars, in accordance with an embodiment of the present invention.

FIG. 26 is a cross-sectional side view showing formation of a shield layer on the sidewalls of the stack of alternating nanosheet channels, sacrificial segments, and support pillars, extension of the separation trenches through the buried sacrificial sections to form buried sacrificial segments, and removal of the buried sacrificial segments from the support pillars, in accordance with an embodiment of the present invention.

In one or more embodiments, a shield layer 360 can be formed on the sidewalls of the stack of alternating nanosheet channels 145, sacrificial segments 135, first sacrificial segment 125, and support pillar 115, where the shield layer 360 can be formed by a conformal deposition (e.g., ALD, PEALD). Portions of the shield layer 360 can be removed from the bottom surface of the separation trenches 200 using a selective, directional etch (e.g., RIE).

In various embodiments, the shield layer 360 can be made of silicon oxide (SiO), silicon nitride (SiN), silicon oxynitride (SiON), silicon carbide (SiC), silicon carbonitride (SiCN), silicon boro carbonitride (SiBCN), and combinations thereof.

In various embodiments, the shield layer 360 can have a thickness in a range of about 1 nm to about 6 nm, although other thicknesses are also contemplated.

In one or more embodiments, the separation trenches 200 can be extended through the buried sacrificial section 118 to form buried sacrificial segment 119. After extension of the separation trenches 200, the bottom of the separation trenches 200 can be below the bottom of the isolation trenches 170.

In one or more embodiments, the buried sacrificial segment 119 can be removed to form cavities between the substrate 110 and the support pillar 115.

Figure 27:
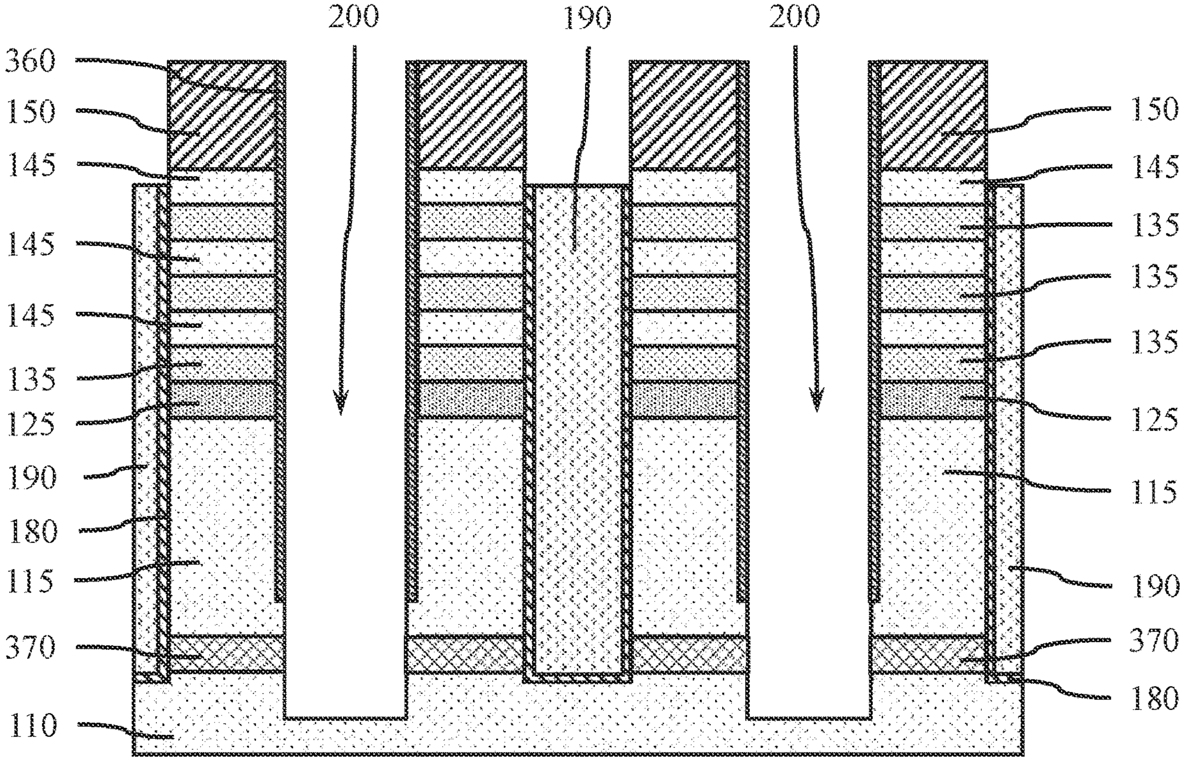
FIG. 27 is a cross-sectional side view showing formation of an etch-stop layer in the cavities formed by removing the buried sacrificial segments, in accordance with an embodiment of the present invention.

FIG. 27 is a cross-sectional side view showing formation of an etch-stop layer in the cavities formed by removing the buried sacrificial segments, in accordance with an embodiment of the present invention.

In one or more embodiments, an etch-stop layer 370 can be formed in the cavities formed by removing the buried sacrificial segments 119, where the etch-stop layer 370 can be formed by a conformal deposition (e.g., ALD, PEALD). A portion of the etch-stop layer 370 in the separation trenches 200 can be removed using a selective, isotropic etch.

In various embodiments, the etch-stop layer 370 can be made of a dielectric material, including, but not limited to, aluminum oxide (AlO), aluminum nitride (AlN), silicon carbide (SiC), and combinations thereof.

Figure 28:
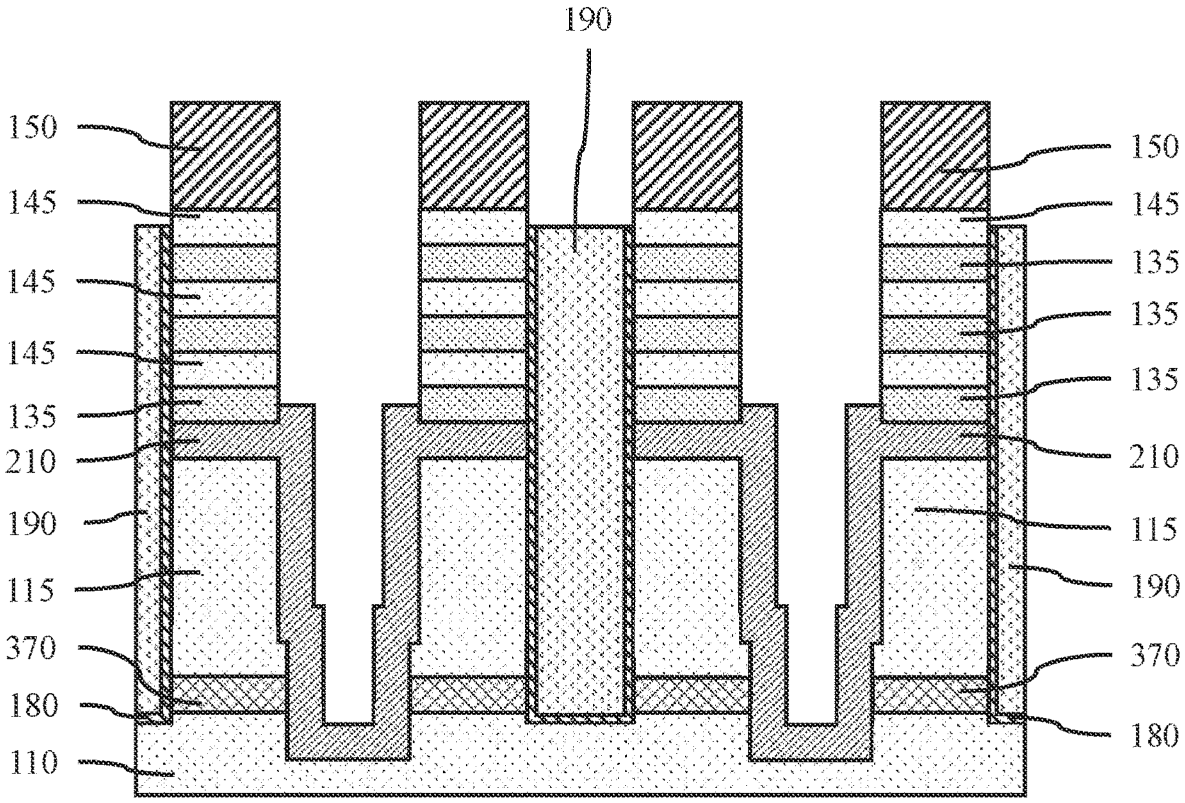
FIG. 28 is a cross-sectional side view showing formation of a protective liner in the gaps formed by removal of the first sacrificial segments, and along the sidewalls of the support pillars, in accordance with an embodiment of the present invention.

FIG. 28 is a cross-sectional side view showing formation of a protective liner in the gaps formed by removal of the first sacrificial segments, and along the sidewalls of the support pillars, in accordance with an embodiment of the present invention.

In one or more embodiments, the shield layer 360 can be removed from the sidewalls of the separation trenches 200, where the shield layer 360 can be removed using a selective, isotropic etch. Removal of the shield layer 360 can leave a step in the support pillars 115 having a width of the thickness of the shield layer 360.

In one or more embodiments, a protective liner 210 can be formed in the cavity formed by removal of the first sacrificial segments 125 and along the sidewalls of the separation trench 200, where the protective liner 210 can be formed by a conformal deposition (e.g., ALD, PEALD). The protective liner 210 can cover the exposed surfaces of the support pillars 115, etch-stop layer 370, and the bottom surface of the separation trench 200.

In various embodiments, the protective liner 210 can be an electrically insulating dielectric material, including, but not limited to, silicon nitride (SiN), silicon carbide (SiC), silicon oxy carbide (SiOC), silicon oxy carbonitride (SiOCN), silicon boro carbonitride (SiBCN), and combinations thereof, where the protective liner 210 can have a dielectric constant less than the dielectric constant of silicon dioxide ($SiO_2$).

In various embodiments, the protective liner 210 can have a thickness in a range of about 3 nm to about 20 nm, or about 5 nm to about 10 nm, although other thicknesses are also contemplated. The protective liner 210 can have a thickness of about half the height of the cavity formed by removing the first sacrificial segments 125, where the protective liner 210 can fill in the cavity.

In one or more embodiments, a disposable fill 220 can be formed on the protective liner 210 in the separation trenches 200, where the disposable fill 220 can be formed be a conformal deposition (e.g., ALD, PEALD) to fill in the trench space between the sidewalls of the protective liner 210.

In various embodiments, the disposable fill 220 can be an OPL.

In various embodiments, the disposable fill 220 and protective liner 210 can be etched back to expose the sides of the nanosheet channels 145 and sacrificial segments 135, where the top surfaces of the disposable fill 220 and protective liner 210 can be between the top and bottom surfaces of the bottom layer, for example, the lower most sacrificial segment 135.

In various embodiments, the additional processes to form the buried power rail 230, power rail cap 240, gate structure 250, source/drains 270, source/drain contacts 280, ILD layer 290, metallization layers and carrier wafer bonding can be conducted. The substrate 110 and devices can be flipped and substrate 110—can be removed stopping on the etch stop layer 370 and dielectric liner 210.

Figure 29:
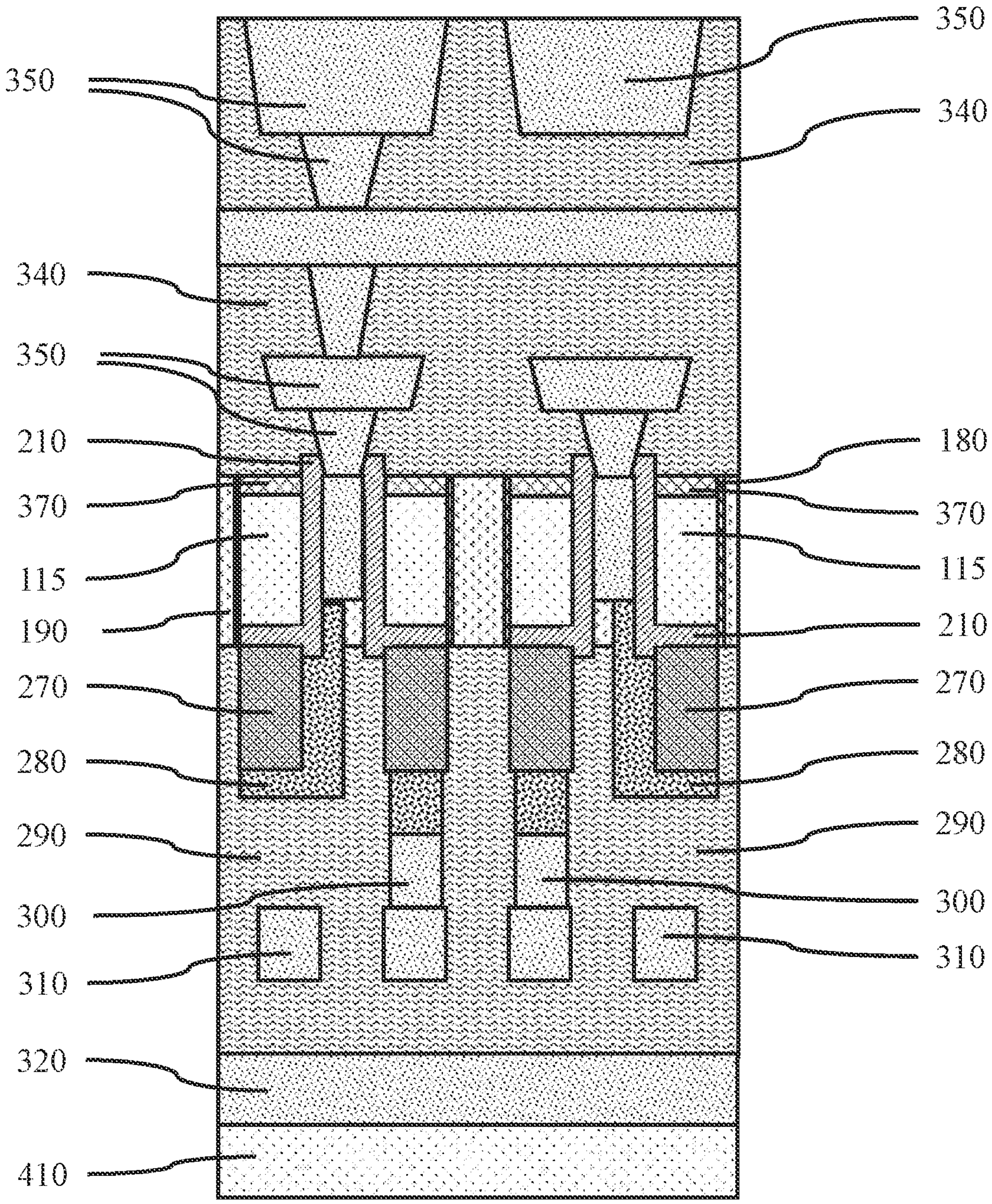
FIG. 29 is a cross-sectional side view showing formation of an backside interlayer dielectric (BILD) layer on the etch-stop layer, protective liner, and semiconductor devices, in accordance with an embodiment of the present invention.

FIG. 29 is a cross-sectional side view showing formation of an backside interlayer dielectric (BILD) layer on the etch-stop layer, protective liner, and semiconductor devices, in accordance with an embodiment of the present invention.

In one or more embodiments, an backside interlayer dielectric (BILD) layer 340 can be formed on the protective liner 210, the etch stop layer 370, and the trench liner 180, where the BILD layer 340 can be formed by a blanket deposition (e.g., CVD, PECVD).

In one or more embodiments, the backside interconnect 350 can be formed with lithography and etching process, followed by metallization, such as Cu metallization. A backside interconnect 350 can be formed in the BILD to wire the buried power rail 230 to backside power supplies.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:

a protective liner;

a buried power rail on a first portion of the protective liner, wherein the protective liner is on opposite sides of the buried power rail and wherein the buried power rail penetrates through the protective liner to make electrical contact with a backside interconnect;

a source/drain on a second portion of the protective liner, wherein the second portion is over a support pillar, the source/drain is offset from the buried power rail, and the protective liner continuously extends on a top surface, a bottom surface, and a sidewall surface of the support pillar, wherein the first portion and the second portion of the protective liner have a same thickness; and a source/drain contact on the source/drain and in electrical communication with the buried power rail.

2. The semiconductor device of claim 1, wherein the support pillar is on an opposite side of the second portion of the protective liner from the source/drain.

3. The semiconductor device of claim 2, wherein a third portion of the protective liner is on an opposite side of the support pillar from the second portion of the protective liner.

4. The semiconductor device of claim 2, further comprising a power rail cap on the buried power rail, wherein the source/drain contact passes through the power rail cap.

5. The semiconductor device of claim 4, wherein a portion of the protective liner is between the power rail cap and the support pillar.

6. The semiconductor device of claim 4, wherein the backside interconnect is electrically connected to the buried power rail on a side opposite the source/drain contact.

7. The semiconductor device of claim 2, further comprising an etch-stop layer on an opposite side of the support pillar from the second portion of the protective liner.

8. The semiconductor device of claim 2, further comprising a plurality of nanochannels on the second portion of the protective liner, wherein the source/drain is in electrical contact with the plurality of nanochannels.

9. The semiconductor device of claim 8, further comprising a gate structure on the plurality of nanochannels.

10. The semiconductor device of claim 9, further comprising a gate cut slab adjoining the gate structure.

11. The semiconductor device of claim 9, further comprising an isolation region adjoining the support pillar and the protective liner.

12. The semiconductor device of claim 1, wherein the backside interconnect is in a backside interlayer dielectric layer on a bottom surface of the protective liner.

13. A semiconductor device, comprising:

a protective liner on a support pillar;

a buried power rail on a first portion of the protective liner, wherein the protective liner is on opposite sides of the buried power rail and wherein the buried power rail penetrates through the protective liner to make electrical contact with a backside interconnect;

a source/drain on a second portion of the protective liner, wherein the support pillar is on an opposite side of the second portion of the protective liner from the source/drain and wherein the protective liner continuously extends on a top surface, a bottom surface, and a sidewall surface of the support pillar, wherein the first portion and the second portion of the protective liner have a same thickness;

a plurality of nanochannels on the second portion of the protective liner, wherein the source/drain is in electrical contact with the plurality of nanochannels; and a source/drain contact on the source/drain and in electrical communication with the buried power rail.

14. The semiconductor device of claim 13, further comprising a power rail cap on the buried power rail, wherein the source/drain contact passes through the power rail cap.

15. The semiconductor device of claim 14, further comprising a gate structure on the plurality of nanochannels.

16. The semiconductor device of claim 14, wherein a third portion of the protective liner is on an opposite side of the support pillar from the second portion of the protective liner.

17. The semiconductor device of claim 14, further comprising an etch-stop layer on an opposite side of the support pillar from the second portion of the protective liner.

18. The semiconductor device of claim 14, further wherein the backside interconnect is electrically connected to the buried power rail on a side opposite the source/drain contact.

19. The semiconductor device of claim 14, wherein a portion of the protective liner is between the power rail cap and the support pillar.

20. The semiconductor device of claim 13, wherein the backside interconnect is in a backside interlayer dielectric layer on a bottom surface of the protective liner.

* * * * *